United States Patent
Kim

(10) Patent No.: US 9,431,123 B2
(45) Date of Patent: Aug. 30, 2016

(54) METHOD CONTROLLING READ SEQUENCE OF NONVOLATILE MEMORY DEVICE AND MEMORY SYSTEM PERFORMING SAME

(71) Applicant: Kyung-Ryun Kim, Daejeon (KR)

(72) Inventor: Kyung-Ryun Kim, Daejeon (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 66 days.

(21) Appl. No.: 14/457,424

(22) Filed: Aug. 12, 2014

(65) Prior Publication Data

US 2015/0049547 A1 Feb. 19, 2015

(30) Foreign Application Priority Data

Aug. 14, 2013 (KR) .................. 10-2013-0096237

(51) Int. Cl.
*G11C 16/32* (2006.01)
*G11C 16/26* (2006.01)
*G11C 29/02* (2006.01)
*G11C 16/00* (2006.01)

(52) U.S. Cl.
CPC ............... *G11C 16/32* (2013.01); *G11C 16/26* (2013.01); *G11C 29/023* (2013.01); *G11C 29/028* (2013.01); *G11C 16/00* (2013.01)

(58) Field of Classification Search
CPC .............................. G11C 16/32; G11C 16/26
USPC .................................... 365/185.09
See application file for complete search history.

(56) References Cited

U.S. PATENT DOCUMENTS

| | | | |
|---|---|---|---|
| 6,851,016 B2 | 2/2005 | Janzen et al. | |
| 7,609,553 B2 | 10/2009 | Hwang | |
| 7,620,789 B2 | 11/2009 | Jeddeloh | |
| 7,907,446 B2 | 3/2011 | Shimizu et al. | |
| 8,050,086 B2* | 11/2011 | Shalvi | G11C 16/26 365/185.02 |
| 8,125,833 B2 | 2/2012 | Sharon et al. | |
| 8,194,449 B2* | 6/2012 | Park | G11C 16/26 365/185.03 |
| 8,264,886 B2 | 9/2012 | Yu et al. | |
| 2005/0246498 A1* | 11/2005 | Schupper | A01M 1/14 711/125 |
| 2007/0171714 A1* | 7/2007 | Wu | G06F 11/1068 365/185.09 |
| 2007/0233449 A1 | 10/2007 | Peterson et al. | |
| 2009/0310404 A1 | 12/2009 | Cho et al. | |
| 2010/0131701 A1 | 5/2010 | Fujiwara | |
| 2011/0194347 A1* | 8/2011 | Chae | G11C 11/5628 365/185.03 |
| 2012/0314496 A1 | 12/2012 | Chae | |
| 2012/0331210 A1* | 12/2012 | Jeong | G11C 11/5642 711/103 |
| 2014/0040531 A1* | 2/2014 | Wu | G06F 11/1048 711/103 |
| 2014/0229131 A1* | 8/2014 | Cohen | G11C 16/0483 702/64 |

FOREIGN PATENT DOCUMENTS

| | | |
|---|---|---|
| JP | 2005316674 A | 11/2005 |
| KR | 1020090117172 A | 11/2009 |
| KR | 1020090129205 A | 12/2009 |

\* cited by examiner

*Primary Examiner* — Hoai V Ho
*Assistant Examiner* — Muna A Techane
(74) *Attorney, Agent, or Firm* — Volentine & Whitt, PLLC

(57) ABSTRACT

To control a read sequence of a nonvolatile memory device, a plurality of read sequences are set and the read sequences respectively correspond to operating conditions different from each other. The read sequences are performed selectively based on sequence selection rates respectively corresponding to the read sequences. Read latencies of the respective read sequences are monitored and the sequence selection rates are adjusted based on monitoring results of the read latencies.

20 Claims, 30 Drawing Sheets

LTAB

| CHIP # | LATENCY INFORMATION | | |
|---|---|---|---|
| | RSEQ1 | RSEQ2 | RSEQ3 |
| 1 | m(tLAT11) | m(tLAT21) | m(tLAT31) |
| 2 | m(tLAT12) | m(tLAT22) | m(tLAT32) |
| 3 | m(tLAT13) | m(tLAT23) | m(tLAT33) |
| ⋮ | ⋮ | ⋮ | ⋮ |

METHOD CONTROLLING READ SEQUENCE OF NONVOLATILE MEMORY DEVICE AND MEMORY SYSTEM PERFORMING SAME

CROSS-REFERENCE TO RELATED APPLICATION

This U.S. non-provisional application claims priority under 35 USC §119 to Korean Patent Application No. 10-2013-0096237 filed on Aug. 14, 2013, the subject matter of which is hereby incorporated by reference.

BACKGROUND

Embodiments of the inventive concept relate generally to semiconductor memory devices, and more particularly to methods of controlling a read sequence of a nonvolatile memory device, as well as memory systems incorporating nonvolatile memory devices operated in this manner.

There are many different types of nonvolatile memory devices, wherein constituent memory cells operate according to different principles. For example, the memory cells of a flash memory device store data in relation to a plurality of threshold voltage distributions, while memory cells of a resistive memory device store data in accordance with a plurality of resistance distributions. In either case, each respective "distribution" is assigned a corresponding logic state for stored data.

Once written (or programmed) to a nonvolatile memory cell, data may subsequently be read by determining whether a selected (or target) memory cell is turned ON or OFF when a particular read voltage is applied. Thus, one or more read voltage(s) will usually be defined in view of the distributions intended to characterize the stored data, and to which the constituent nonvolatile memory cells are programmed.

Unfortunately, during or after the programming of a memory cell, its intended distribution may become altered or distorted by a number of events or conditions including, for example charge leakage, program disturbances, read disturbances, word and/or bit line coupling, temperature change, voltage change, degeneration of the memory cell, etc. In extreme cases, an intended distribution may become so shifted and/or broadened that a "read fail" occurs.

When a read fail occurs, certain nonvolatile memory devices may execute a different type of read operation (i.e., one having a different read sequence) than the one causing the read fail. However, it is not easy to set a read sequence that properly accounts for the many events and conditions that might have altered the distributions being read. Accordingly, "read latency" (i.e., the period of time required to read stored data) may increase as changes in the current operating conditions are assessed or identified in terms of an acceptable read sequence, and performance of the nonvolatile memory device may be degraded with extension of its read latencies.

SUMMARY

Certain embodiments of the inventive concept provide method(s) of reading data in a nonvolatile memory device, wherein such methods adaptively define an appropriate read sequence in accordance with change(s) in memory system operating conditions.

According to one embodiment, the inventive concept provides a method of controlling execution of a read sequence in a nonvolatile memory device, the method comprising; setting read sequences, each read sequence respectively corresponding to a different set of operating conditions, performing the read sequences based on respective sequence selection rates corresponding to the read sequences, monitoring read latencies for each one of the read sequences, and adjusting at least one of the sequence selection rates based on the monitored read latencies.

BRIEF DESCRIPTION OF THE DRAWINGS

Certain embodiments of the inventive concept will be more clearly understood from the following detailed description taken in conjunction with the accompanying drawings.

DETAILED DESCRIPTION

Certain embodiments of the inventive concept will now be described in some additional detail with reference to the accompanying drawings. The inventive concept may, however, be embodied in many different forms and should not be construed as being limited to only the illustrated embodiments. Rather, these embodiments are provided so that this disclosure will be thorough and complete, and will fully convey the scope of the present inventive concept to those skilled in the art. Throughout the written description and drawings, like reference number and labels are used to denote like or similar elements.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
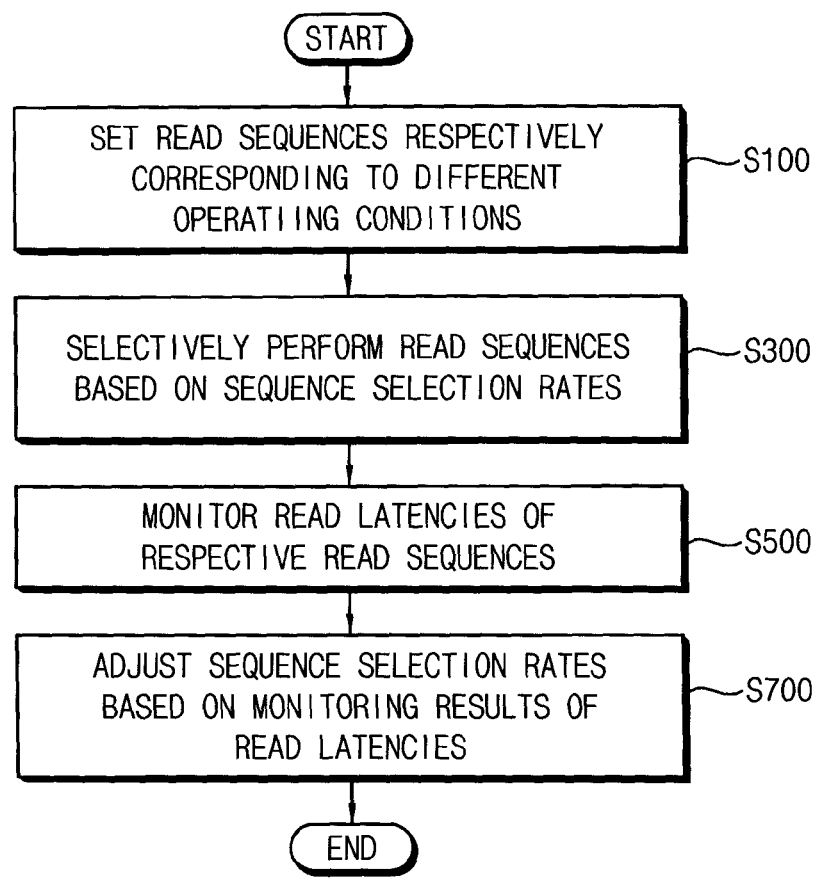
FIG. 1 is a flowchart summarizing in one example a method of controlling a read sequence for reading a nonvolatile memory device according to certain embodiments of the inventive concept.

FIG. 1 is a flowchart summarizing a method of controlling a read sequence of a nonvolatile memory device according to certain embodiments of the inventive concept.

Referring to FIG. 1, a plurality of read sequences are set (S100) for reading data in the nonvolatile memory device. Here, each respective read sequence corresponds to a different set of operating conditions. The plurality of read sequences will include at least two (2) different read sequences. As noted above, the operating conditions of a memory system or nonvolatile memory device may be changed due to one or more events and/or factors. Such factors may include system level, device level, and/or environmental level factors. Changes in the operating conditions of a memory system and/or memory device will be reflected in a bit error rate (BER) of the read data being provided from the memory device. That is, as operating conditions vary, so too will the resulting BER of read data provided by a memory device. Hence, read sequences for the memory device may be set in accordance with different ranges of the BER.

Thus, returning to the flowchart of FIG. 1, once the plurality of read sequences has been set (S100), the read sequences may be selectively performed based on sequence selection rates respectively corresponding to the read sequences (S300). As a result, whenever a read operation is requested by (e.g.,) a memory controller, a particular read sequence is selected from among the plurality of set read sequences. The read operation is then performed using the selected read sequence until valid data is obtained. Here, the "sequence selection rate" represents a selection frequency for the corresponding read sequence. For example, if the sequence selection rate is 0.1, the corresponding read sequence will be selected only about one time out of every ten times.

In view of the foregoing, resulting read latencies for the respective read sequences are monitored (S500). This monitoring of read latencies may be performed continuously and in real-time. For example, the monitoring results of the read latencies may be represented by the average latencies of the respective read sequences. Whenever a read sequence is selected and performed, the corresponding average latency may be upgraded to realize the real-time control of the read sequence.

Accordingly, the sequence selection rates may be adjusted based on the monitoring results of the read latencies (S700). For example, an "optimal read sequence" may be varied in this manner according to changes in the current operating conditions. Such change in the operating conditions may be de-facto monitored by monitoring changes in the read latencies, and the sequence selection rates may be adjusted, such that data reading is performed primarily in accordance with the optimal read sequence. In this context, as will be appreciated by those skilled in the art, the term "optimal" should not be construed as meaning only a mathematically certain or absolutely best read sequence. Rather, the term subsumes a range of practically optimal conditions under which read data may usefully be retrieved by the memory systems and/or nonvolatile memory devices contemplated by embodiments of the inventive concept.

In a nonvolatile memory device, such as the flash memory device, an executed read operation may under adverse operating conditions result in a read fail (i.e., a failure to obtain valid data). To cope with the possibility of obtaining a read fail, a read sequences may be set (or defined) so that multiple read operations (or read tries) may be performed in an attempt to obtain valid read data. Conventional nonvolatile memory devices (and related memory systems) usually only set one read sequence in anticipation of a read fail being obtained. However, this fixed read sequence approach has proved increasingly unable to address the growing range of operating condition variations that afflict contemporary memory systems. Thus, certain embodiments of the inventive concept provide a plurality of read sequences, and an adaptively modifiable plurality of read sequences, that are better able to address increased variation in the operating conditions of memory systems and memory devices. The performance of the nonvolatile memory device may be enhanced by controlling the read sequence adaptively according to change(s) in the operating condition(s) of the memory system based on the monitoring results of the read latencies. As a result, the operating speed of nonvolatile memory devices within various embodiments of the inventive concept may be improved by adaptively selecting an optimal read sequence.

Figure 2:
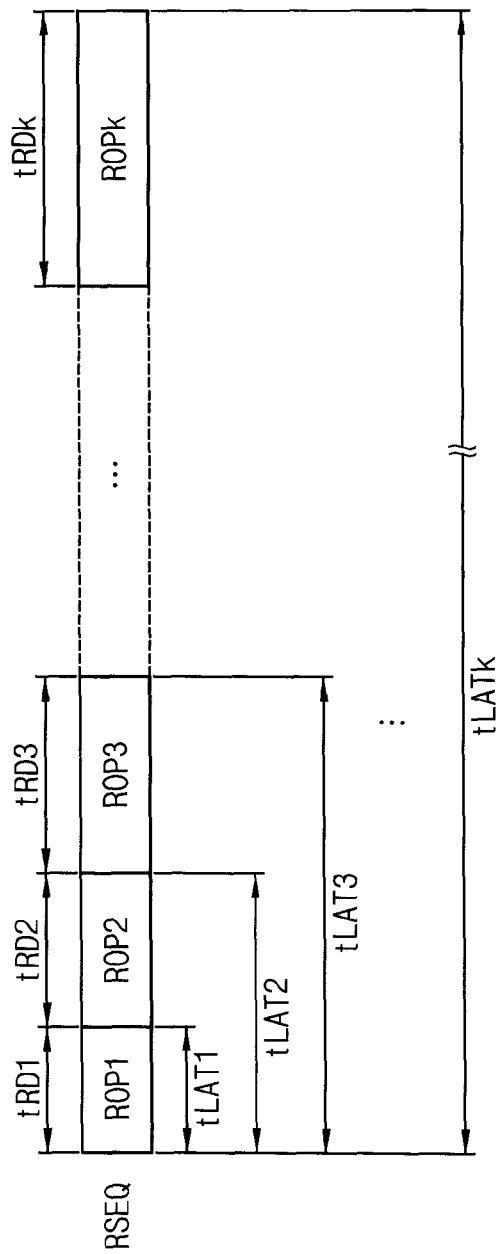
FIG. 2 is a timing diagram illustrating an exemplary read sequence according to certain embodiments of the inventive concept.

FIG. 2 is a diagram illustrating in one example a read sequence according to certain embodiments of the inventive concept.

Referring to FIG. 2, each read sequence RSEQ may include a plurality of read operations ROP1~ROPk having respective read times tRD1~tRDk different from each other.

There is a trade-off between length of read time and the accuracy of the corresponding read operation. In other words, read operations having shorter read times also have a higher probability of a read fail outcome, while read operations having longer read times have a higher probability of a successful read operation outcome. Accordingly each read sequence RSEQ may be set such that a read operation having the shorter read time will be performed before a read operation having the longer read time, as illustrated for example in FIG. 2. Here, the first read operation ROP1 having a shortest read time tRD1 is first performed, then a second read operation ROP2 having a second read time tRD2 longer than the first read time tRD1 is performed after the first read operation ROP1, and then a third read operation ROP3 having the third read time tRD3 longer than the second read time tRD2 is performed after the second read operation ROP2, and then so forth up to a k-th read operation ROPk having the longest read time tRDk.

Each of the read operations ROP1~ROPk may be performed using error checking and correction (ECC) decoding. The read operations ROP1~ROPk in the selected read sequence RSEQ may be performed sequentially until valid data is obtained, as properly indicated by the ECC decoding. Once valid data are obtained, later read operations will not be performed, and the read sequence RSEQ is ended.

As a result, the read latency associated with the selected read sequence corresponds to a sum of the read times of the read operations that are performed until the valid data is obtained. In the illustrated example of FIG. 2, the read latency tLAT1 corresponds to the first read time tRD1 if valid data is obtained by the first read operation ROP1, the read latency tLAT2 corresponds to a sum tRD1+tRD2 for the first read time tRD1 and the second read time tRD2 if valid data is obtained by the second read operation ROP2, the read latency tLAT3 corresponds to a sum tRD1+tRD2+tRD3 for the first read time tRD1, the second read time tRD2 and the third read time tRD3 if valid data is obtained by the third read operation ROP3, and the read latency tLATk corresponds to a sum tRD1+tRD2+ . . . +tRDk of all read times tRD1~tRDk if valid data is obtained by the last read operation ROPk.

Figure 3:
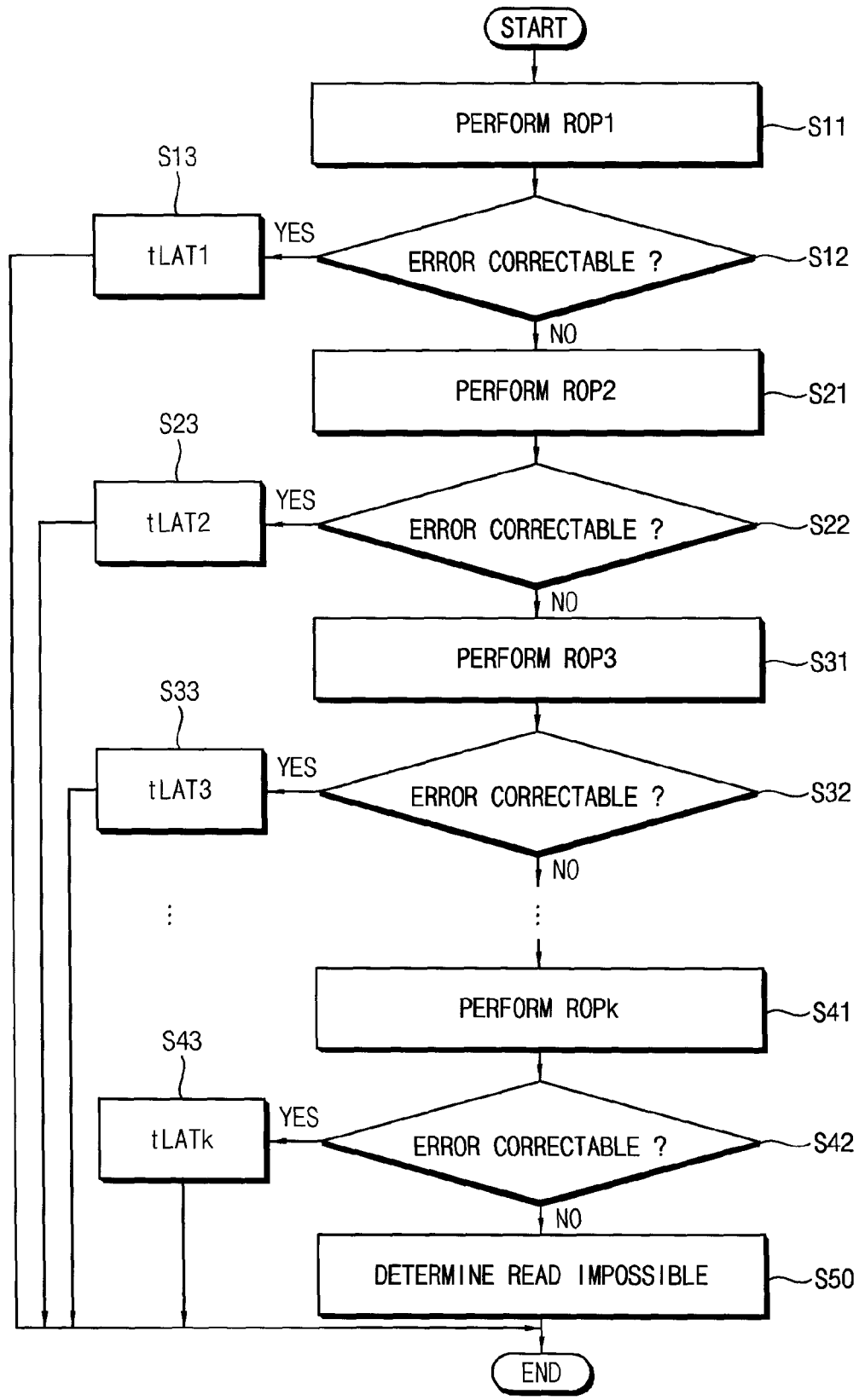
FIG. 3 is a flowchart further illustrating a method of reading data in accordance with the read sequence of FIG. 2.

FIG. 3 is a flowchart further illustrating the method of reading data according to the read sequences assumed by the approach illustrated in FIG. 2.

Referring to FIG. 3, according to the set read sequence RSEQ, the first read operation ROP1 of the highest priority is performed (S11). Here, as with the example of FIG. 2, it is assumed that each read operation is performed in conjunction with ECC decoding. Thus, when error(s) in the read data are determined to be correctable by the ECC decoding (S12=YES), the first read time tRD1 of the first read operation ROP1 is determined as the read latency tLAT1 (S13). Thus, as the error(s), if any, are correctable, valid data is obtained and the read sequence RSEQ is ended.

However, when error(s) are not correctable (S12=NO), the second read operation ROP2 of the next priority is performed (S21). Again, if the resulting error(s) in the read data, if any, are determined to be correctable by the ECC decoding (S22=YES), the sum tRD+tRD2 of the read times of the first and second read operations ROP1 and ROP2 is determined as the read latency tLAT2 (S23).

However, if the error(s) are not correctable (S22=NO), the third read operation ROP3 of the next priority is performed (S31). Again, if error(s) in the read data, if any, are determined to be correctable by the ECC decoding (S32=YES), the sum tRD1+tRD2+tRD3 of the read times of the first, second and third read operations ROP1, ROP2 and ROP3 is determined as the read latency tLAT3 (S33).

In this manner, so long as valid data is not obtained through the execution of read operations having the higher priorities, variously set read operation are sequentially performed up until a last read operation ROPk is performed (S41). So finally, if the error(s) in the read data, if any, are determined to be correctable by the ECC decoding (S42=YES), then a sum tRD1+tRD2+ . . . +tRDk of the read times of all read operations ROP1~ROPk is determined as the read latency tLATk (S43).

Yet, if valid data is not obtained by the last read operation ROPk, it is determined that the current read operation is impossible (S50) (i.e., a read fail occurs), and the read sequence RSEQ is ended.

If the operating conditions are not too adverse, valid data will be obtained by the first read operation ROP1 in many cases. Thus, the read latency may be minimized by use of the illustrated read sequence, such that execution of the overall read operation may be performed with minimal practical read latency. However, if the operating conditions degrade, valid data will probably not be obtained by use of only the first read operation. Therefore, second and possibly subsequent read operations having respective priorities may be performed. This necessity will obviously extend the read latency of the overall read operation. Thus, the performance of a nonvolatile memory device consistent with embodiments of the inventive concept may be enhanced by setting a plurality of read sequences respectively corresponding to different operating conditions, wherein the use of a particular read sequence among the plurality of read sequences may be adaptively selected.

Figure 4:
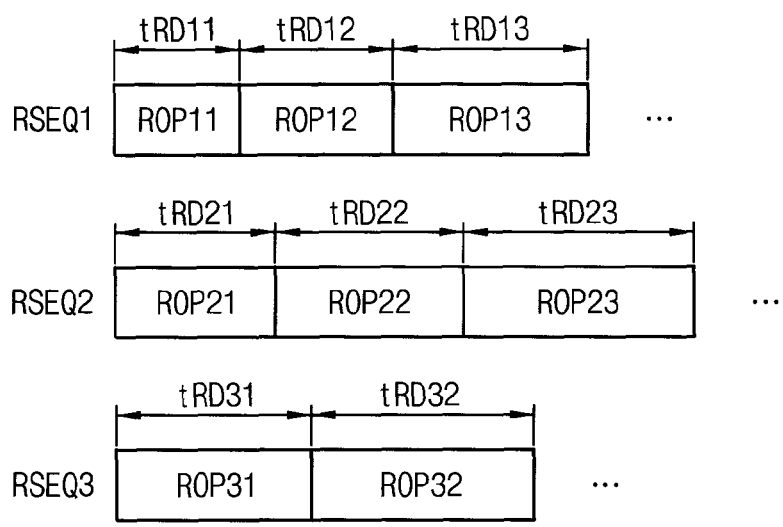
FIG. 4 is a diagram illustrating a number of read sequences that may be performed by certain embodiments of the inventive concept.

FIG. 4 is a diagram further illustrating in one example a plurality of read sequences that may be used in certain embodiments of the inventive concept.

FIG. 4 assumes a simple case in which only three (3) read sequences are provided for use by an embodiment of the inventive concept. Those skilled in the art will understand that four or more read sequences, or only two read sequence might be used in other embodiments of the inventive concept. However, even in the simple example of FIG. 4, it may be seen that each one of the first read sequence RSEQ1, second read sequence RSEQ2 and third read sequence RSEQ3 may be used to effectively provide read operation execution having a least read latency period sufficient to ensure obtaining valid data.

For example, the read times of the read operations ROP11, ROP12 and ROP13 in the first read sequence RSEQ1 may satisfy the relation tRD11<tRD12<tRD13, the read times of the read operations ROP21, ROP22 and ROP23 in the second read sequence RSEQ2 may satisfy the relation tRD21<tRD22<tRD23, and the read times of the read operations ROP31 and ROP32 in the third read sequence RSEQ3 may satisfy tRD31<tRD32.

Thus, the first read sequence RSEQ1 may be set such that the first read operation ROP1 having a first read time tRD11 is performed first in the first read sequence RSEQ1, and the second read sequence RSEQ2 may be set such that the second read operation ROP21 having a second read time tRD21 longer than the first read time tRD11 is performed first in the second read sequence RSEQ2. As the probability of read success by the first read operation ROP11 is increased, the first read sequence RSEQ1 is more proper than the second read sequence RSEQ2. In contrast, as the probability of read success by the first read operation ROP11 is decreased, the second read sequence RSEQ2 is more proper than the first read sequence RSEQ1. In other words, the first read sequence RSEQ1 is preferable to the second read sequence RSEQ2 as the bit error rate (BER) decreases, and the second read sequence RSEQ2 is preferable to the first read sequence RSEQ1 as the BER increases.

The third read sequence RSEQ3 may be set such that a third read operation ROP31 having a third read time tRD31 longer than the second read time tRD21 is performed first in the third read sequence RSEQ3. As the probability of read success by the second read operation ROP21 increases, the second read sequence RSEQ2 is more proper than the third read sequence RSEQ3. In contrast, as the probability of read success by the second read operation ROP21 is decreased, the third read sequence RSEQ3 is more proper than the second read sequence RSEQ2. In other words, the second read sequence RSEQ2 is preferable to the third read sequence RSEQ3 as the BER decreases, and the third read sequence RSEQ3 is preferable to the second read sequence RSEQ2 as the BER increases.

As such, the first read sequence RSEQ1 may be set for operating conditions associated with a relatively lower range of the BER, the second read sequence RSEQ2 may be set for operating conditions associated with an intermediate range of the BER, and the third read sequence RSEQ3 may be set for operating conditions associated with a relatively higher range of the BER.

Figure 5:
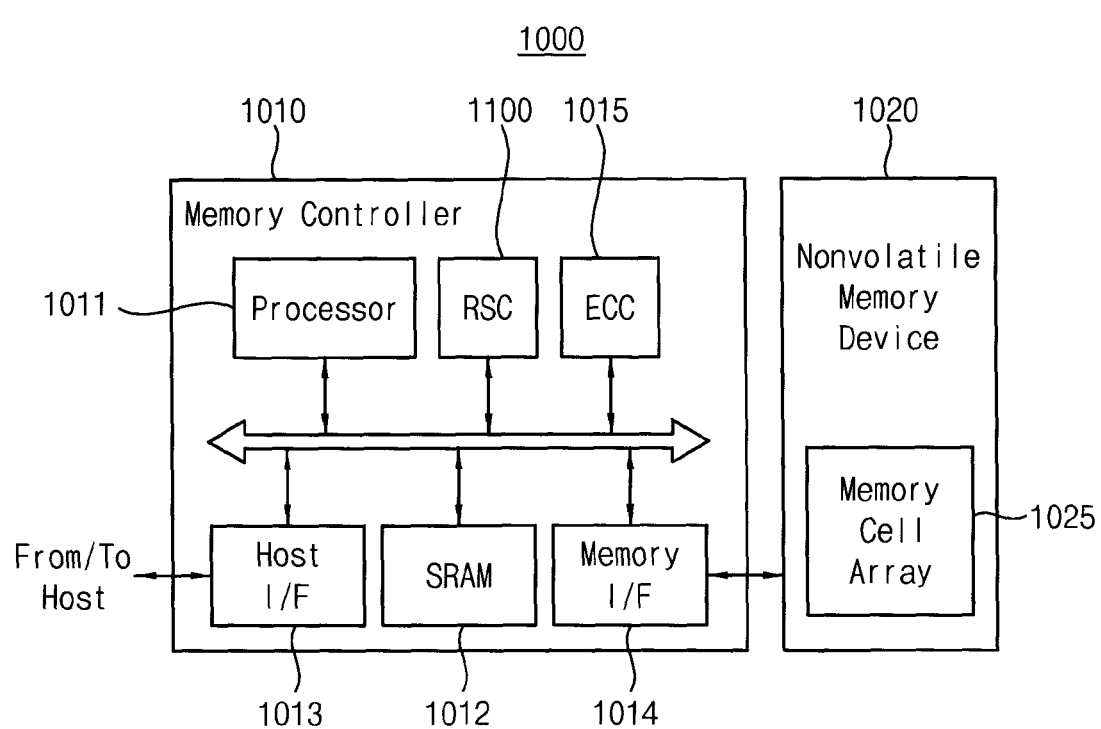
FIG. 5 is a block diagram illustrating in one example a memory system including a nonvolatile memory device and a memory controller according to certain embodiments of the inventive concept.

FIG. 5 is a block diagram illustrating in one example a memory system including a nonvolatile memory device and a memory controller according to certain embodiments of the inventive concept.

Referring to FIG. 5, a memory system 1000 generally includes a memory controller 1010 and a nonvolatile memory device 1020.

The nonvolatile memory device 1020 includes a memory cell array 1025 including a plurality of memory cells that store data. Examples of the nonvolatile memory device 1020 will be described in some additional detail with reference to FIGS. 24 through 31. The memory controller 1010 may be configured to store a plurality of read sequences that are set to respectively correspond to different operating conditions, selectively perform the read sequences based on sequence selection rates respectively corresponding to the read sequences, monitor read latencies of the respective read sequences and adjust the sequence selection rates based on monitoring results of the read latencies.

The memory controller 1010 may further be used to control the overall operation of the nonvolatile memory device 1020. The memory controller 1010 may control data transfer between an external host and the nonvolatile memory device 1020. The memory controller 1010 may include a processor 1011, such as a central processing unit (CPU), a buffer memory 1012, a host interface 1013, a memory interface 1014, an ECC block 1015 and read sequence controller (RSC) 1100. The processor 1011 may perform operations for the data transfer. In some embodiments, the buffer memory 1012 may be implemented by a static random access memory (SRAM). In other embodiments, a dynamic random access memory (DRAM), a phase random access memory (PRAM), a ferroelectric random access memory (FRAM), a resistive random access memory (RRAM), a magnetic random access memory (MRAM), etc. According to embodiments, the buffer memory 1012 may be located inside or outside the memory controller 1010.

The host interface 1013 may be coupled to the host, and the memory interface 1014 may be coupled to the nonvolatile memory device 1020. The processor 1011 may communicate with the host via the host interface 1013. For example, the host interface 1013 may be configured to communicate with the host using at least one of various interface protocols, such as a universal serial bus (USB), a multi-media card (MMC), a peripheral component interconnect-express (PCI-E), a small computer system interface (SCSI), a serial-attached SCSI (SAS), a serial advanced technology attachment (SATA), a parallel advanced technology attachment (PATA), an enhanced small disk interface (ESDI), integrated drive electronics (IDE), etc. Further, the processor 1011 may communicate with the nonvolatile memory device 1020 via the memory interface 1014. In some embodiments, the ECC block 1015 may perform ECC encoding and ECC decoding by using a Bose-Chaudhuri-Hocquenghem (BCH) code. In other embodiments, the ECC block 1015 may perform the ECC encoding and the ECC decoding by using a low density parity check (LDPC) code. In still other embodiments, the ECC block 1015 may perform the ECC encoding and the ECC decoding by using a turbo code, a Reed-Solomon code, a convolution code, a recursive systematic code (RSC), a coded modulation, such as a trellis-coded modulation (TCM), a block coded modulation (BCM), etc., or other error correction codes. According to embodiments, the memory controller 1010 may be built in the nonvolatile memory device 1020, or the memory controller 1010 and the nonvolatile memory device 1020 may be implemented as separate chips. According to embodiments, the ECC block 1015 may be included in the nonvolatile memory device 1020 to reduce the amount of data transfer between the memory controller 1010 and the nonvolatile memory device 1020. In this case, the nonvolatile memory device 1020 may transfer only the information about the read fail and the error bits to the memory controller 1010 in the read fail cases. The nonvolatile memory device 1020 may provide the valid read data, which may be obtained by the ECC decoding, to the memory controller 1010 in the read success cases. The read sequence controller 1100 performs the above-described method of controlling the read sequence. All or a portion of the read sequence controller 1100 may be included in the processor 1011. The read sequence controller 1100 will be further described with reference to FIG. 6.

The memory system 1000 may be implemented as a memory card, a solid state drive, etc. In some embodiments, the nonvolatile memory device 1020, the memory controller 1010 and/or the memory system 1000 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 6:
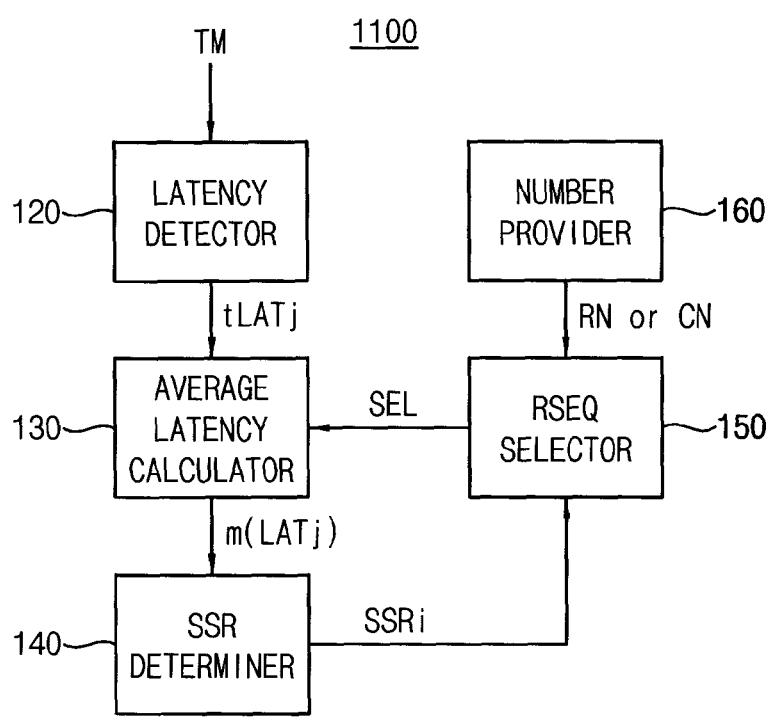
FIG. 6 is a block diagram further illustrating in one example the read sequence controller 100 of FIG. 5.

FIG. 6 is a block diagram further illustrating in one example the read sequence controller 1100 of the memory system of FIG. 5.

Referring to FIG. 6, the read sequence controller 1100 comprises a latency detector 120, an average latency calculator 130, a sequence selection rate (SSR) determiner 140, read sequence (RSEQ) selector 150 and a number provider 160.

The latency detector 120 may be used to provide a current read latency tLATj for the selected read sequence based on a timing signal TM whenever the selected read sequence is finished. For example, the timing signal TM may include a signal indicating a timing point when the original read command is generated or received and a signal indicating a timing point when the read success is determined by the ECC decoding.

The average latency calculator 130 may be used to provide an average latency m(tLATj) of the selected read sequence based on the current read latency tLATj and a selection signal SEL. The read sequence corresponding to the current read latency tLATj may be discriminated based on the selection signal SEL to upgrade the average latency m(tLATj) of the corresponding read sequence using the current read latency tLATj.

In the illustrated embodiment of FIG. 6, each average latency m(tLATj) may be calculated by averaging a predetermined number N of the read latencies L1~LN that are recently detected with respect to the corresponding read sequence according to the relationship: m(tLATj)=[L1+L2+, . . . , +LN]/N.

However, in other embodiments, each average latency m(tLATj) may be calculated by averaging the previously-calculated average latency M(tLATj) and the currently-detected read latency tLATj with respect to the corresponding read sequence according to the relationship: m(tLATj)= [tLATj+M(tLATj)]/2

In still other embodiment, each average latency m(tLATj) may be calculated by weight-averaging the previously-calculated average latency M(tLATj) and the currently-detected read latency tLATj with respect to the corresponding read sequence according to the relationship: m(tLATj)= [W*tLATj+M(tLATj)]/[W+1]. In this last exemplary case, the timing of changing the read sequence according to the change of the read latency may be controlled by properly setting a weighting value W.

The SSR determiner 140 may be used to adjust the sequence selection rates SSRi based on the average latencies respectively corresponding to the read sequences. For example, when the three read sequences RSEQ1, RSEQ2 and RSEQ3 are set as illustrated in FIG. 3, the SSR determiner 140 may provide three sequence selection rates SSR1, SSR2 and SSR3. The SSR determiner 140 may be used to determine a main read sequence among the read sequences so that the main read sequence may correspond to the read sequence having a minimum value of the average latencies, and set the sequence selection rate of the main read sequence larger than the sequence selection rates of the other read sequences. In some embodiments, the sequence selection rate of the main read sequence may be set to a maximum value and the sequence selection rates of the other read sequences may be set commonly to a minimum value for monitoring the read latencies.

For example, the first read sequence RSEQ1 may have the minimum average latency in early stage of using the nonvolatile memory device, and the first read sequence RSEQ1 may be set as the main read sequence. If the minimum value of the sequence selection rate is 0.05 for at least monitoring the read latencies, the sequence selection rates may be determined as SSR1=0.90, SSR2=0.05 and SSR3=0.05. In case that the operating condition is changed and the main read sequence is changed from the first read sequence RSEQ1 to the second read sequence RSEQ2, the sequence selection rates may be adjusted as SSR1=0.05, SSR2=0.90 and SSR3=0.05.

The RSEQ selector 150 may generate the selection signal SEL that indicates what read sequence is selected and performed currently. For example, when SSR1=0.90, SSR2=0.05 and SSR3=0.05, the RSEQ selector generates the selection signal SEL such that the first read sequence RSEQ1 may be selected ninety times out of one hundred, the second read sequence RSEQ2 may be selected five times out of one hundred, and the third read sequence RSEQ3 may be selected five times out of one hundred. The selection signal SEL may be provided to the processor 1011 in FIG. 5 and the processor 1011 may select the one read sequence in response to the selection signal SEL.

In some embodiments, the RSEQ selector 150 may select the read sequences irregularly based on a random number RN and the sequence selection rates SSRi. For example, when SSR1=0.90, SSR2=0.05, SSR=0.05, the second read sequence RSEQ2 may be selected if the remainder is 0, 20, 40, 60, 80 when the random number RN is divided by 100, the third read sequence RSEQ3 may be selected if the remainder is 10, 30, 50, 70, 90 when the random number RN is divided by 100 and the first read sequence RSEQ1 corresponding to the main read sequence may be selected in the rest cases. In this case, the number provider 160 may include a random number generator or a random number table for the providing the random number RN.

In other embodiments, the RSEQ selector 150 may select the read sequences regularly based on the sequence selection rates SSRi. For example, the read sequences may be selected using a count number CN that is increased or decreased sequentially whenever the read command is generated. When SSR1=0.90, SSR2=0.05, SSR=0.05, the second read sequence RSEQ2 may be selected if the remainder is 0, 20, 40, 60, 80 when the count number CN is divided by 100, the third read sequence RSEQ3 may be selected if the remainder is 10, 30, 50, 70, 90 when the count number CN is divided by 100 and the first read sequence RSEQ1 corresponding to the main read sequence may be selected in the rest cases. In this case, the number provider 160 may include a counter for the providing the count number CN.

At least a portion of the read sequence controller 1100 shown in FIG. 6 may be implemented as software including program codes and/or data that are stored and readable by a computer, and the program codes may be provided to the processor 1011 in FIG. 5.

Figure 7:
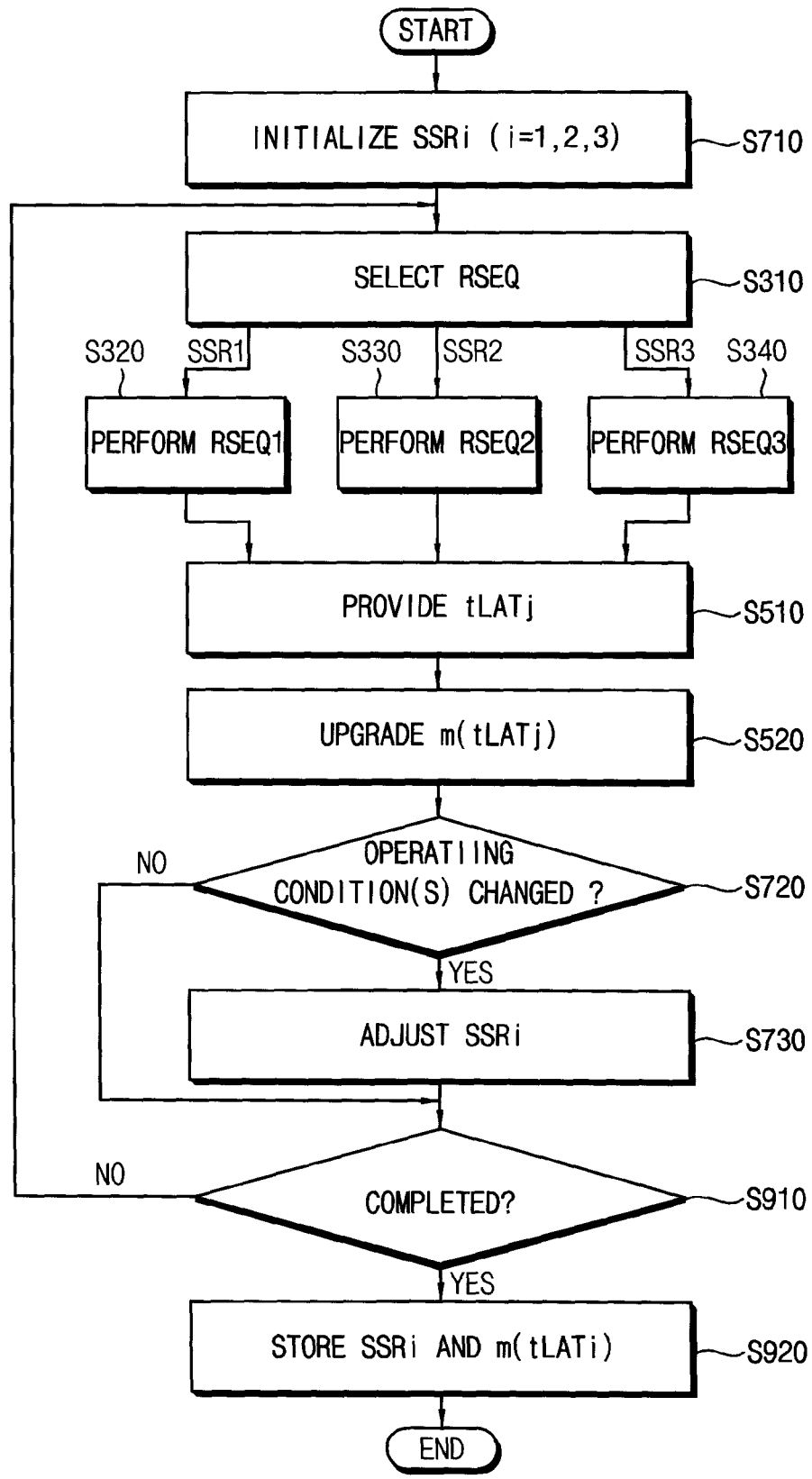
FIG. 7 is a flowchart summarizing a method of controlling a read sequence for reading a nonvolatile memory device according to certain embodiments of the inventive concept.

FIG. 7 is a flowchart summarizing a method of controlling a read sequence for a nonvolatile memory device according to certain embodiments of the inventive concept. FIG. 7 examples wherein three read sequences RSEQi (i=1,2,3) may variously be set according to different embodiments of the inventive concept.

Referring collectively to FIGS. 5, 6 and 7, the sequence selection rates SSRi respectively corresponding to the read sequences RSEQi are initialized (S710). The initialized sequence selection rates SSRi are adjusted or maintained whenever one read sequence is performed depending on the change of the operating condition.

One read sequence is selected (S310) among the read sequences RSEQi based on the current read selection rates SSRi and the selected one read sequence RSEQj is performed each time (S320, S330, S340). The current read latency tLATj of the selected read sequence RSEQj is provided (S510) after the read sequence RSEQj is finished as described with reference to FIG. 3. The corresponding average latency m(tLATj) is upgraded (S520) using the provided current read latency tLATj. Based on the average latencies m(tLAT1), m(tLAT2) and m(tLAT3), it is determined whether the operating condition is changed (S720). When the operating condition is changed (S720=YES), the sequence selection rates SSRi are adjusted (S730) to reflect the change of the operating condition. However, when the operating conditions are not materially changed (S720=NO), the sequence selection rates SSRi are maintained.

When the operation of the nonvolatile memory device is completed (S910: YES), the current sequence selection rates SSRi and the current average latencies m(tLATi) may be stored in the memory controller or the nonvolatile memory device. When the operation of the nonvolatile memory device is not completed (S910=NO), the above-mentioned processes are repeated based on the adjusted or maintained sequence selection rates SSRi.

As such, whenever one read sequence is performed, the read latencies may be monitored and the sequence selection rates may be adjusted based on the monitoring results to enhance the performance of the nonvolatile memory device.

Figure 8:
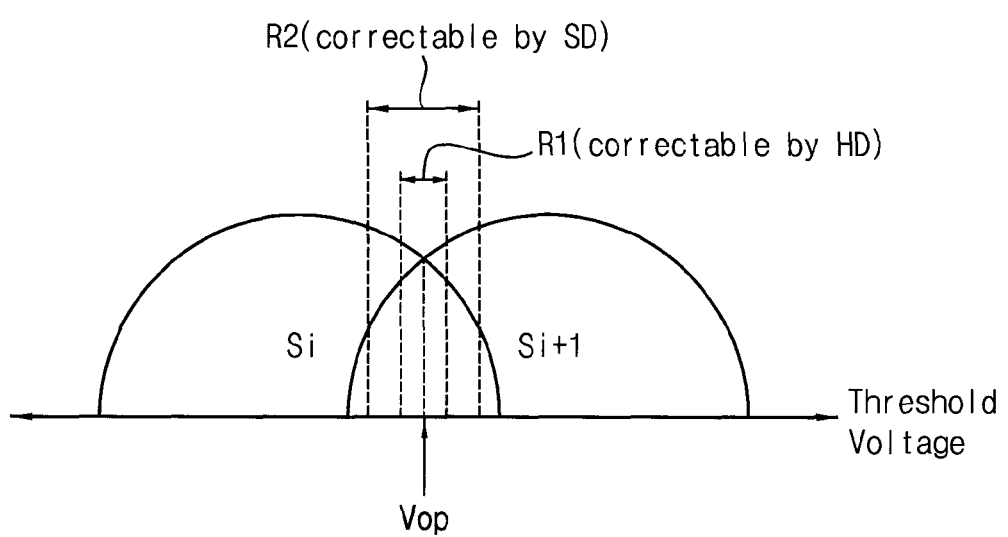
FIG. 8 is a conceptual diagram illustrating a predetermined read voltage and an optimal read voltage.

FIG. 8 is a conceptual diagram illustrating a predetermined read voltage and an optimal read voltage. Threshold voltage distributions for two adjacent states Si and Si+1 are shown in FIG. 8 assuming the use of a flash memory device in one embodiments of the inventive concept. However, those skilled in the art will recognize that the description that follows may be applied to adjacent resistance distributions in a case where a resistive memory device is assumed.

An optimal read voltage Vop is a read voltage leading to a minimum number of error bits among data bits that are read out simultaneously. The optimal read voltage Vop corresponds to a valley, that is, a cross point of the threshold voltage distributions of the two states Si and Si+1. When the distributions are shifted and/or broadened according to change of the operating condition, the difference between the predetermined read voltage and the optimal read voltage. As this difference increases, the BER or the probability of the read fail also increases.

When the predetermined voltage is included in a first voltage range R1, the error in the read data may be corrected by the ECC decoding with hard decision (HD). When the predetermined voltage is included in a second voltage range R2, the error in the read data may be corrected by the ECC decoding with soft decision (SD). Examples of certain HD and SD will be described in some additional detail with reference to FIGS. 17 through 21.

When bit errors in the read data are too numerous and the predetermined read voltage is out of the second range R2, valid data will not be obtained using applicable ECC decoding. When valid data is not by execution of previous read operations based on the predetermined read voltage, a valley search operation may be performed to determine the optimal read voltage Vop. Thereafter, a read operation may be performed using the optimal read voltage. Examples of the valley search operation will be described with reference to FIGS. 12 and 13. Such valley search operations and read operations based on an optimal read operation may be referred to as a "voltage-compensation read operation". In some embodiments, each of the read sequences may include a read operation based on the predetermined read voltage with the higher priority, and the at least one voltage-compensation read operation with the lower priority, as illustrated in FIGS. 9, 10 and 11.

Figure 9:
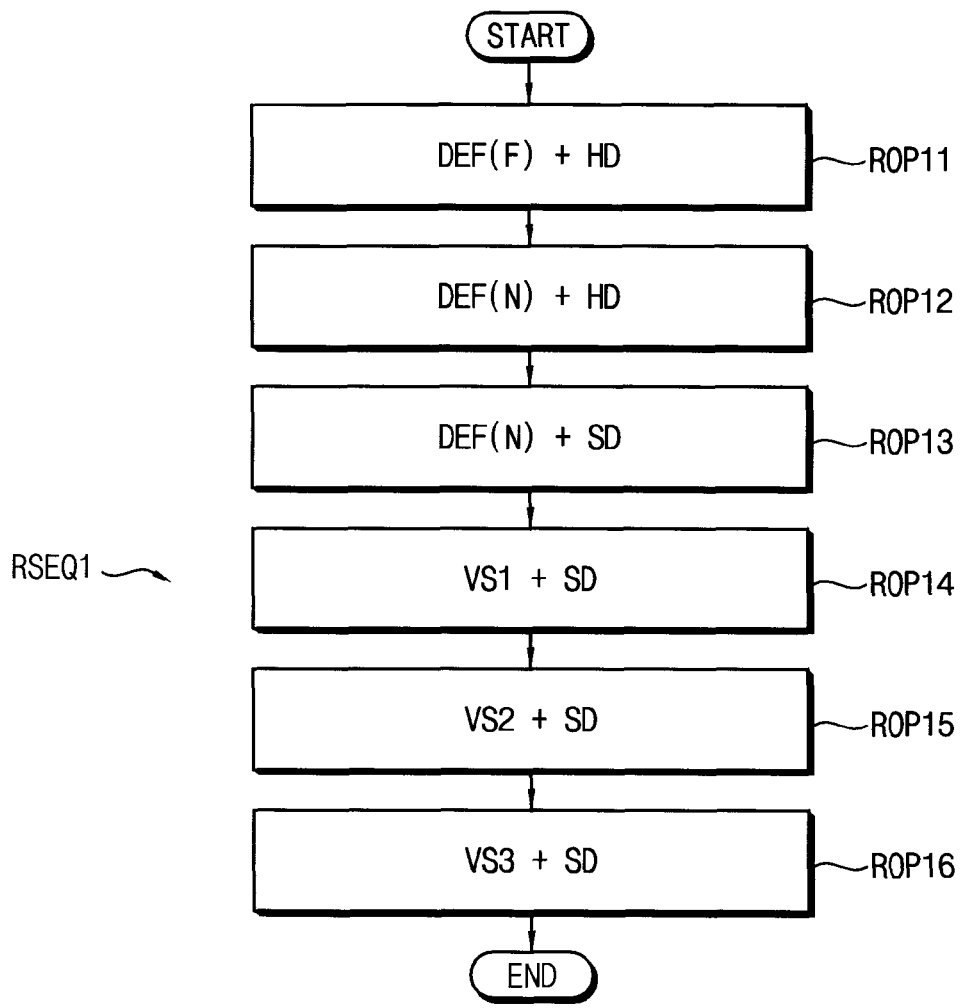
FIGS. 9, 10 and 11 are respective diagrams further illustrating the read sequences of FIG. 4 according to certain embodiments of the inventive concept.
Figure 10:
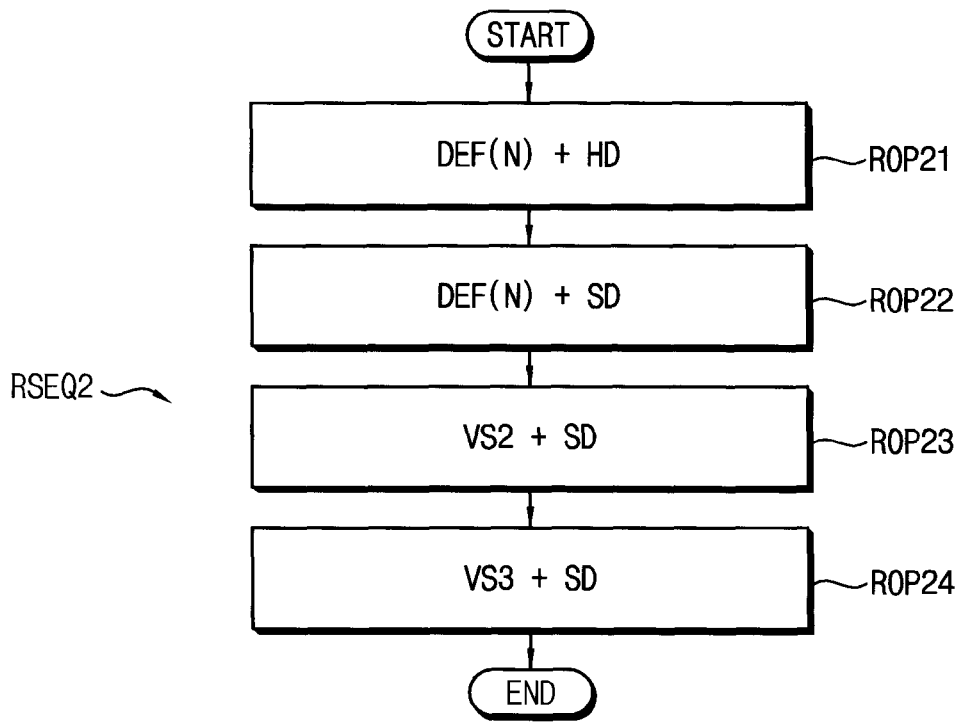
Figure 11:
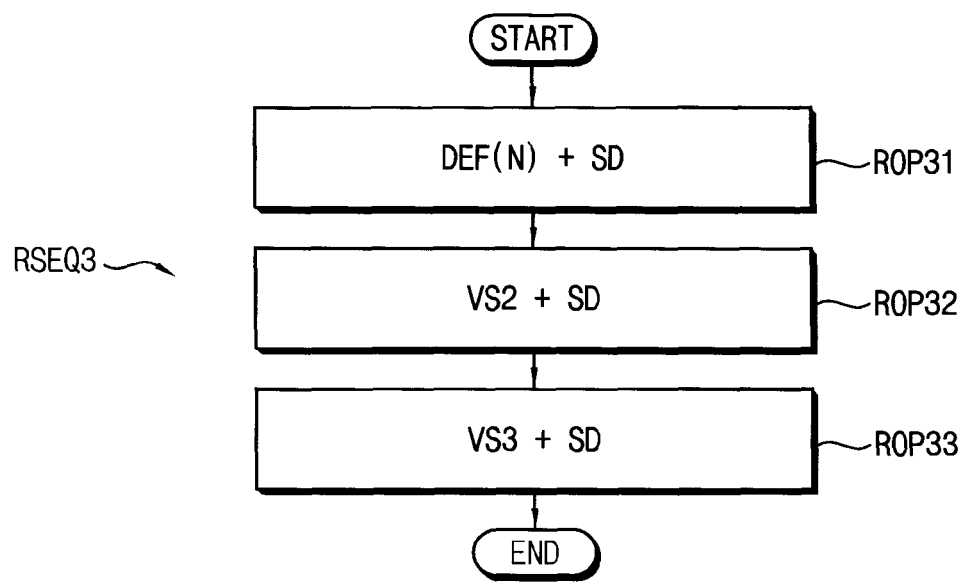

FIGS. 9, 10 and 11 are respective diagrams illustrating read sequences according to certain embodiments of the inventive concept. However, the read sequences shown in FIGS. 9, 10 and 11 are merely exemplary of a much broader range of read sequences contemplated by the inventive concept.

Referring to FIG. 9, the first read sequence RSEQ1 may include first through sixth read operations ROP11~ROP16, which are arranged according to respective priorities. The first, second and third read operations ROP11, ROP12 and ROP13 may be based on the predetermined read voltage, and the fourth, fifth and sixth read operations ROP14, ROP15 and ROP16 may be the voltage-compensation read operations.

As described above, a read operation having the shorter read time may be performed before a read operation having the longer read time. In other words, the priory of the read operations may be higher as the read time is shorter. The first read operation ROP11 having the shortest read time, that is, the first read time tRD11 may be performed first, the second read operation ROP12 having the second read time tRD12 longer than the first read time tRD11 is performed after the first read operation ROP11, and likely the sixth read operation ROP16 having the longest read time tRD16 is performed lastly.

Each of the first and second read operations ROP11 and ROP12 may be a hard decision (HD) read operation that reads out hard decision data using the predetermined read voltage and performs the ECC decoding based on the hard decision data. As will be described in some additional detail with reference to FIGS. 12 and 13, the first read operation ROP11 may be a fast read operation DEF(F) based on the predetermined read voltage and the second read operation ROP12 may be a normal read operation DEF(N) based on the predetermined read voltage.

The third read operation ROP13 may be a soft decision (SD) read operation that reads out the hard decision data using the predetermined read voltage, provides reliability information of the hard decision data using a plurality of read voltages around the predetermined read voltage, and performs the ECC decoding based on the hard decision data and the reliability information.

The fourth, fifth and sixth read operations ROP14, ROP15 and ROP16 may be the voltage-compensation read operations including the valley search operations VS1, VS2 and VS3 and the read operations based on the detected optimal read voltages, respectively. The valley search operations VS1, VS2 and VS3 may be variously implemented to have different search times and different reading accuracies.

Referring to FIG. 10, the second read sequence RSEQ2 may include first through fourth read operations ROP21~ROP24, which are arranged according to respective priorities. The first and second read operations ROP21 and ROP22 may be based on the predetermined read voltage, and the third and fourth read operations ROP23 and ROP24 may be the voltage-compensation read operations.

As described above, the read operation having the shorter read time may be performed before the read operation having the longer read time. The first read operation ROP21 having the shortest read time, that is, the first read time tRD21 may be performed first, the second read operation ROP22 having the second read time tRD22 longer than the first read time tRD21 is performed after the first read operation ROP21, and likely the fourth read operation ROP24 having the longest read time tRD24 is performed lastly. The notations DEF(N), HD, SD, VS2 and VS3 are the same as described with reference to FIG. 9.

Referring to FIG. 11, the third read sequence RSEQ3 may include first, second and third read operations ROP31, ROP32 and ROP33, which are arranged according to respective priorities. The first read operation ROP31 may be based on the predetermined read voltage, and the second and third read operations ROP32 and ROP33 may be the voltage-compensation read operations.

As described above, the read operation having the shorter read time may be performed before the read operation having the longer read time. The first read operation ROP31 having the shortest read time, that is, the first read time tRD31 may be performed first, the second read operation ROP32 having the second read time tRD32 longer than the first read time tRD31 is performed after the first read operation ROP31, and the last read operation ROP33 having the longest read time tRD33 is performed lastly. The notations DEF(N), SD, VS2 and VS3 are the same as described with reference to FIG. 9.

For example, the first read sequence RSEQ1 of FIG. 1 may be set for the operating condition of the relatively lower range of the BER, the second read sequence RSEQ2 of FIG. 10 may be set for the operating condition of the intermediate range of the BER, and the third read sequence RSEQ3 of FIG. 11 may be set for the operating condition of the relatively higher range of the BER. As such, the performance of the nonvolatile memory device may be improved by setting a plurality of read sequences respectively corresponding to the different operating conditions and adaptively controlling the read sequences.

Figure 12:
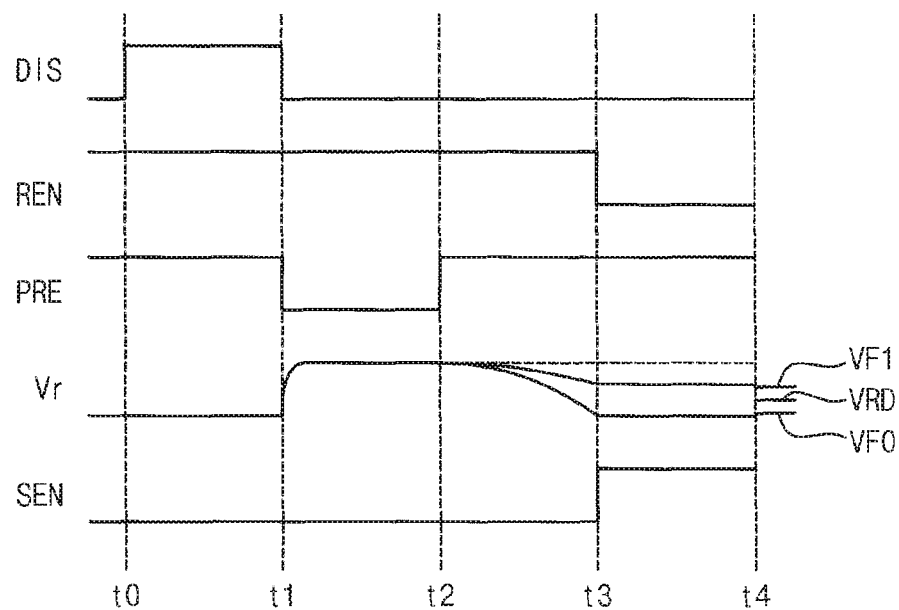
FIG. 12 is a timing diagram further illustrating in one example a read process for a resistive memory device.
Figure 13:
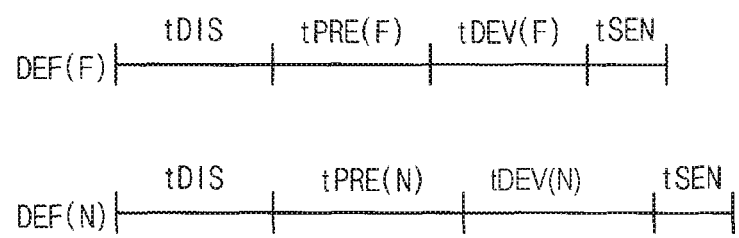
FIG. 13 is a diagram further illustrating the sequencing of the read time in the read process of FIG. 12.

FIG. 12 is a timing diagram illustrating an example of a similar read process that may be performed in a nonvolatile resistive memory device. FIG. 13 is a diagram further describing a read time according to the read process of FIG. 12.

Referring to FIG. 12, when the discharge signal DIS is activated to logic high level during discharge period t0~t1, the bitline voltage Vr is initialized to a ground voltage. When the precharge signal PRE is activated to logic low level during precharge period t1~t2, the bitline voltage Vr is charged with the precharge voltage. When the precharge signal PRE is deactivated to logic high level during develop period t2~t3, the precharge voltage is blocked and the bitline voltage Vr is decreases, where the bitline is connected to the ground voltage through the resistive element of the selected memory cell. The voltage VF1 of the bitline coupled to the off-cell of the relatively higher resistance decreases slowly and the voltage VF0 of the bitline coupled to the on-cell of the relatively lower resistance decreases rapidly.

When the sense enable signal SEN is activated to logic high level during sense period t3~t4, the bitline voltage VF1 or VF0 is compared with the read voltage VRD and the data bit stored in the selected memory cell may be read out.

Even though the data read process for the resistive memory cell is illustrated in FIG. 12, the data read process the same as or similar to FIG. 12 may be applied to the flash memory cell.

FIG. 13 illustrates examples of the fast read operation DEF(F) and the normal read operation DEF(N) which are mentioned in FIG. 9. The data read time may include a discharge time tDIS, a precharge time tPRE, a develop time tDEV and a latching or sensing time tSEN. Even though not illustrated in FIG. 13, the data read time associated with the read latency may further include delay times such as signal transfers between the memory controller and the memory device, address decoding, ECC decoding, etc. The accuracy or reliability of the read data may be enhanced as the precharge time tPRE or the develop time tDEV is increased. In the first read sequence RSEQ of FIG. 9, the sum of the precharge time tPRE(F) and the develop time tDEV(F) of the first read operation ROP11 is shorter than the sum of the precharge time tPRE(N) and the develop time tDEV(N) of the second read operation ROP12.

Figure 14:
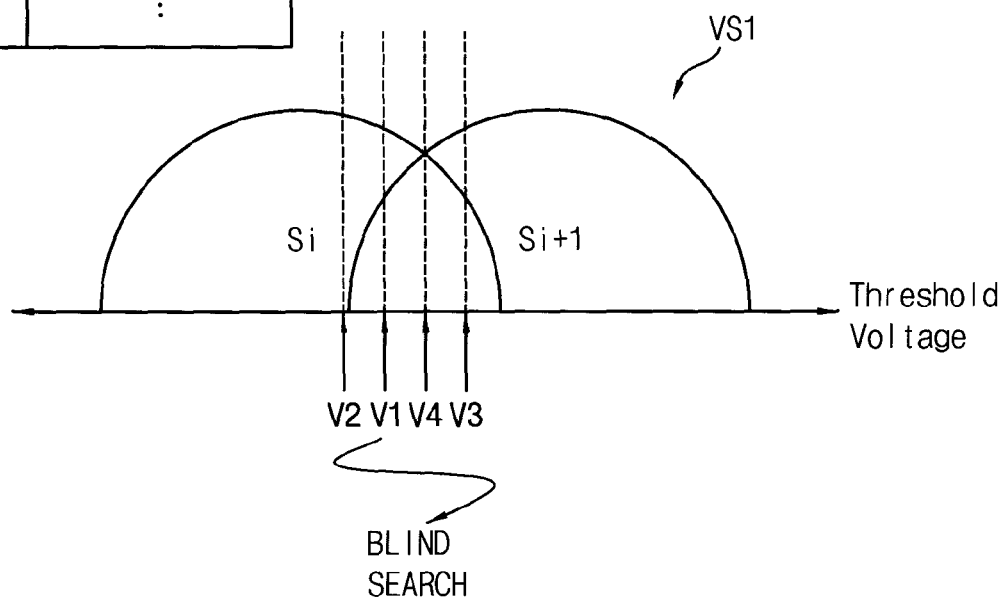
FIGS. 14, 15 and 16 are respective diagrams illustrating valley search methods according to certain embodiments of the inventive concept.
Figure 15:
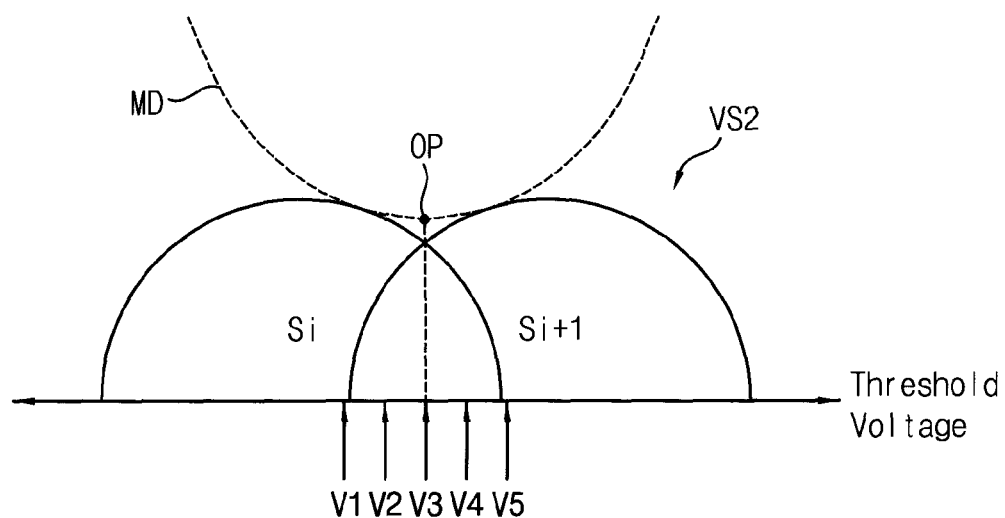
Figure 16:
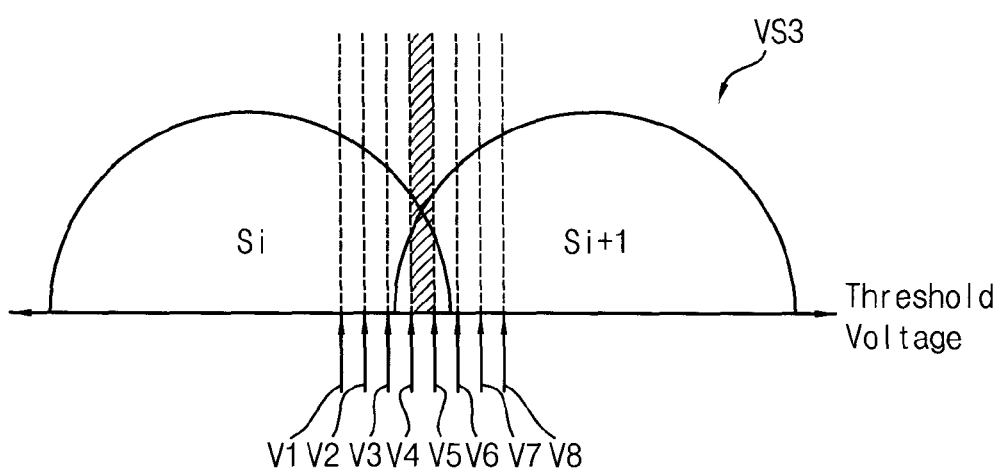

FIGS. 14, 15 and 16 are diagram illustrating valley search methods according to certain embodiments of the inventive concept, but there are other approaches to conducting a valley search that will be appreciated by those skilled in the art.

Referring to FIG. 14, an offset table may be provided by analyzing the shift trends of the memory cells through the various test processes. The first valley search method VS1 may be performed by referring to the offset table and testing the read voltages V1~V4 having higher probability of valley with a blind searching scheme.

Referring to FIG. 15, the second valley search method VS2 may be performed by scanning the distributions around the valley using the read voltages V1~V5 and modeling the second-order curve MD. The voltage corresponding to the vertex of the modeled curve MD may be determined as the optimal read voltage.

Referring to FIG. 16, the third valley search method may be performed by searching the valley point using the read voltages V1~V8 of relatively narrow intervals. The voltage corresponding to a minimum cell number may be determined as the optimal voltage.

The first valley search method VS1 requires the shortest search time but the lowest accuracy. In contrast, the third valley search method VS3 requires the longest search time but the highest accuracy. As such, the read sequences RSEQ1, RSEQ2 and RSEQ3 described with reference to FIGS. 9, 10 and 11 may be set using the various valley search methods or operations VS1, VS2 and VS3 having different searching times and accuracies.

Figure 17:
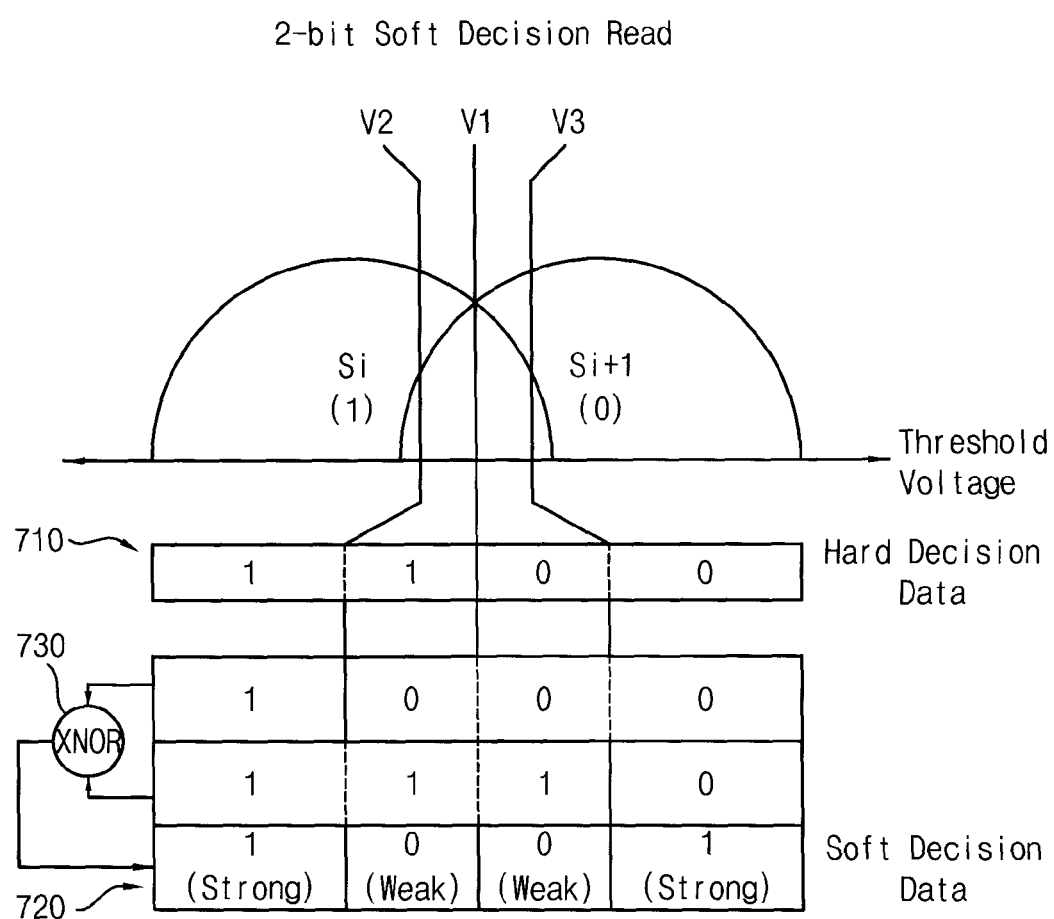
FIG. 17 is a conceptual diagram illustrating one example of a 2-bit soft decision read operation.
Figure 18:
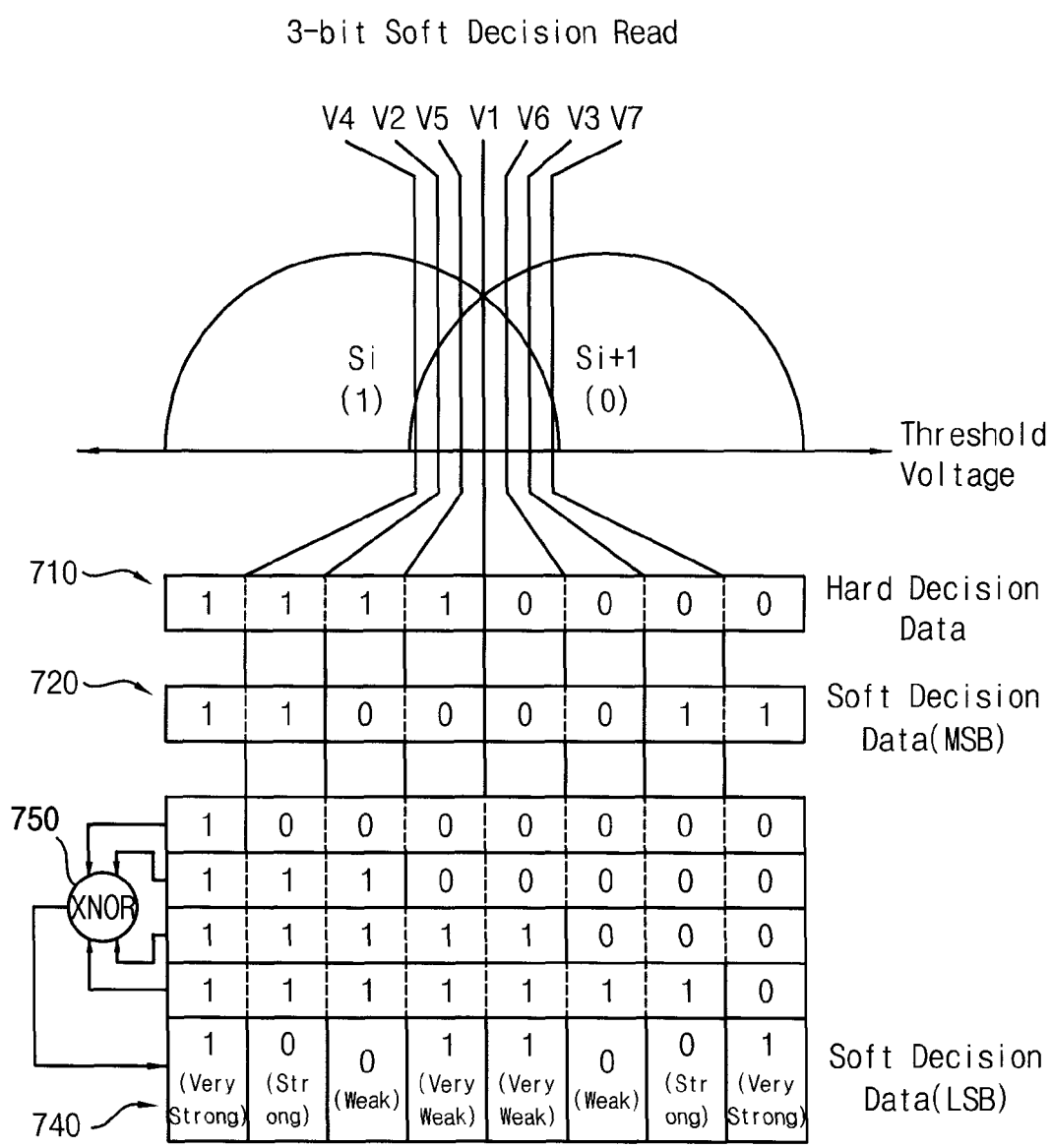
FIG. 18 is a conceptual diagram illustrating one example of a 3-bit soft decision read operation.
Figure 19:
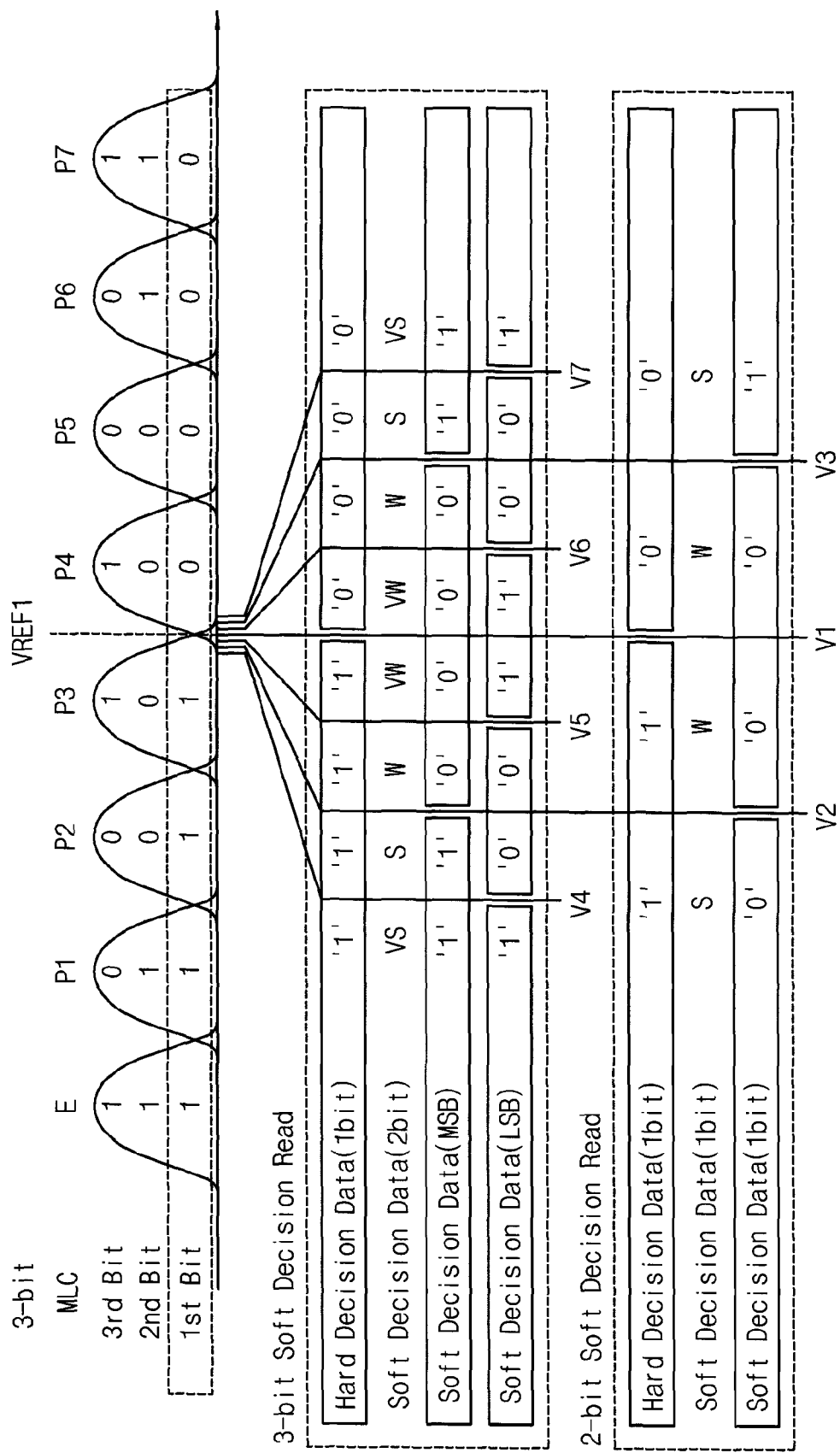
FIGS. 19, 20 and 21 are respective diagrams illustrating one example of a soft decision read operation performed by a nonvolatile memory device including 3-bit multi-level memory cells.
Figure 20:
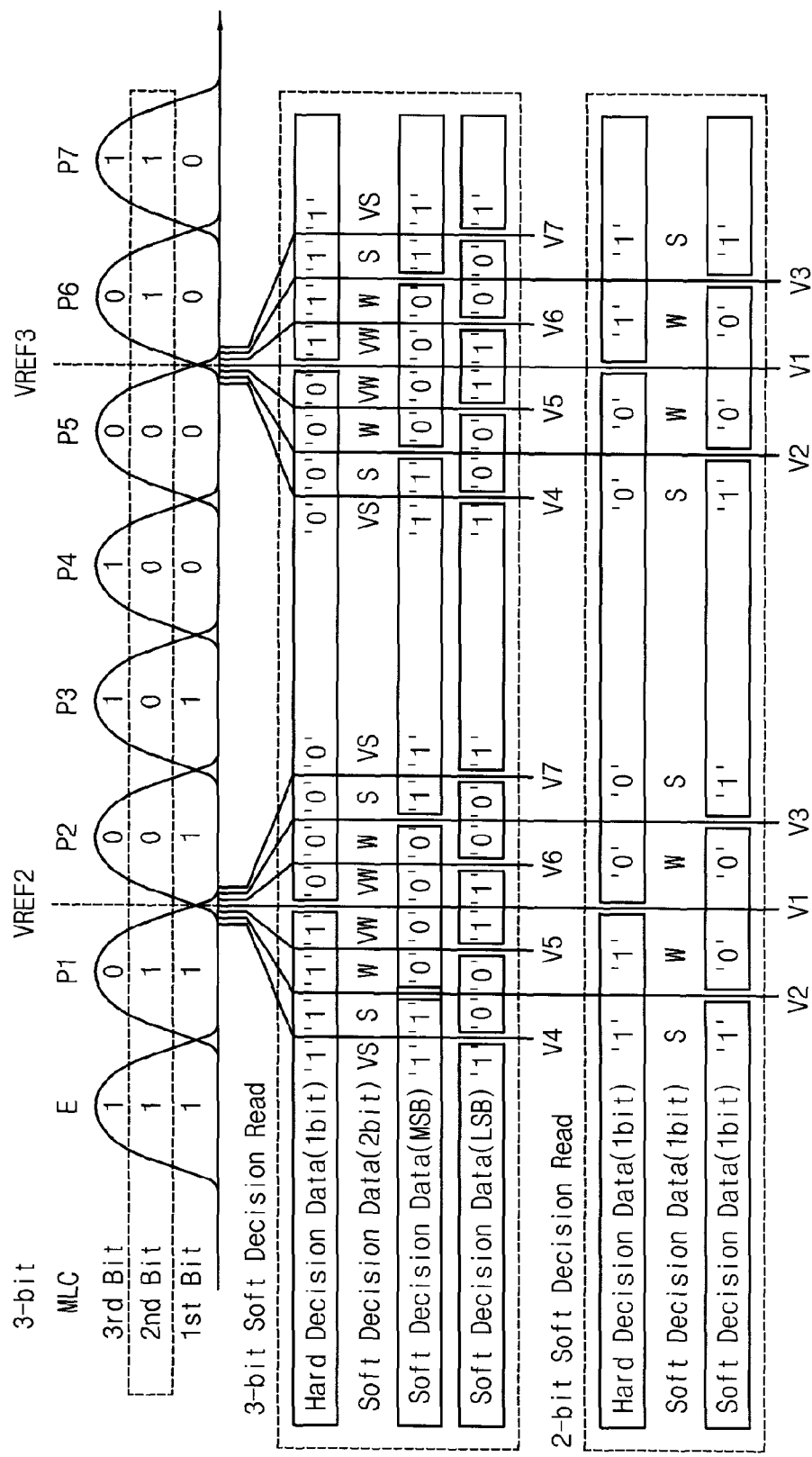
Figure 21:
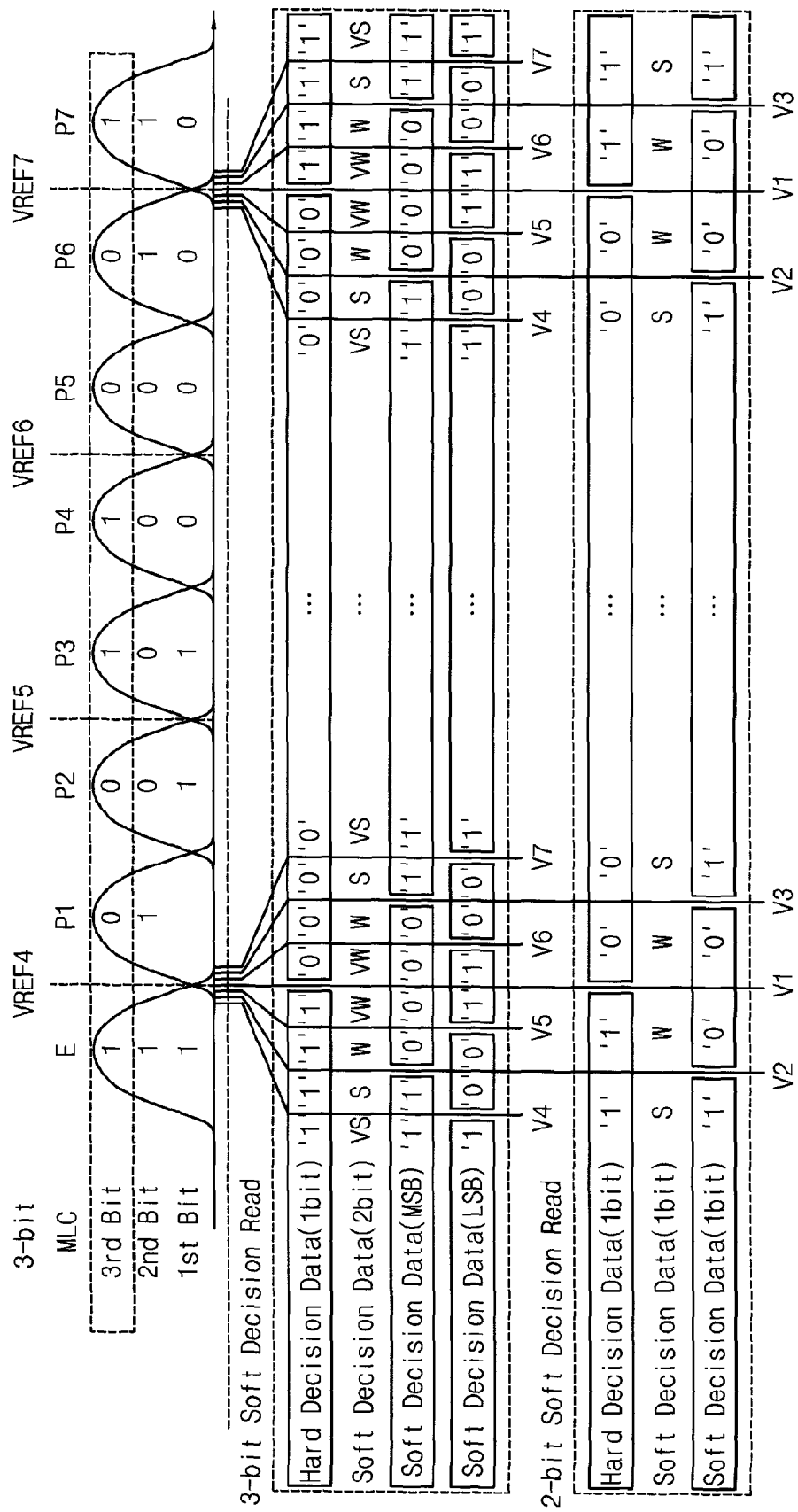

FIG. 17 is a diagram illustrating an example of a 2-bit soft decision read operation, FIG. 18 is a diagram illustrating an example of a 3-bit soft decision read operation, and FIGS. 19, 20 and 21 are respective diagrams illustrating the use of a soft decision read operation performed by a nonvolatile memory device using 3-bit multi-level memory cells.

As illustrated in FIG. 17, the nonvolatile memory device may perform a 2-bit soft decision read operation. The 2-bit soft decision read operation may include three read operations using three voltages V1, V2 and V3 having regular intervals. For example, the three voltages V1, V2 and V3 may include a first voltage V1 having a predetermined reference level for distinguishing between a first state Si corresponding to data '1' and a second state Si+1 corresponding to data '0', a second voltage V2 lower by a predetermined level than the first voltage V1, and a third voltage V3 higher by the predetermined level than the first voltage V1. In some embodiments, data 710 read by using the first voltage V1 having the reference level may be hard decision data 710 read by a hard decision read operation, and the 2-bit soft decision read operation may use the hard decision data 710 read by the hard decision read operation without applying the first voltage V1 having the reference level. The 2-bit soft decision read operation may generate soft decision data 720 having reliability information for the hard decision data 710 by performing a predetermined logical operation (e.g., an XNOR operation 730) (or encoding) on data read by using the second voltage V2 and data read by using the third voltage V3. Each bit of the soft decision data 720 may represent a degree of reliability of a corresponding bit of the hard decision data 710. For example, a bit of the soft decision data 720 having a value of '1' may represent that a corresponding bit of the hard decision data 710 has strong (S) reliability, and a bit of the soft decision data 720 having a value of '0' may represent that a corresponding bit of the hard decision data 710 has weak (W) reliability.

As illustrated in FIG. 18, the nonvolatile memory device may perform a 3-bit soft decision read operation. The 3-bit soft decision read operation may include seven read operations using seven voltages V1, V2, V3, V4, V5, V6 and V7 having regular intervals. For example, the seven voltages V1, V2, V3, V4, V5, V6 and V7 may include the three voltages V1, V2 and V3 used in the 2-bit soft decision read operation, and may further include a fourth voltage V4 lower than the second voltage V2, a fifth voltage V5 between the second voltage V2 and the first voltage V1, a sixth voltage V6 between the first voltage V1 and the third voltage V3, and seventh voltage V7 higher than the third voltage V3. In some embodiments, the data 710 read by using the first voltage V1 may be the hard decision data 710 read by the hard decision read operation. The data 720 read by using the second and third voltages V2 and V3 may be most significant bit (MSB) soft decision data 720 corresponding to the soft decision data 720 read by the 2-bit soft decision read operation. The 3-bit soft decision read operation may generate least significant bit (LSB) soft decision data 740 by performing a predetermined logical operation (e.g., an XNOR operation 750) (or encoding) on data read by using the fourth voltage V4, the fifth voltage V5, the sixth voltage V6 and the seventh voltage V7. Each soft decision data 720 and 740 having two bits may represent a degree of reliability of a corresponding bit of the hard decision data 710. For example, each soft decision data 720 and 740 having a value of '11' may represent that a corresponding bit of the hard decision data 710 has very strong (VS) reliability, each soft decision data 720 and 740 having a value of '10' may represent that a corresponding bit of the hard decision data 710 has strong (S) reliability, each soft decision data 720 and 740 having a value of '00' may represent that a corresponding bit of the hard decision data 710 has weak (W) reliability, each soft decision data 720 and 740 having a value of '01' may represent that a corresponding bit of the hard decision data 710 has very weak (VW) reliability.

Although FIGS. 17 and 18 illustrate two adjacent states Si and Si+1, the 2-bit soft decision read operation and the 3-bit soft decision read operation illustrated in FIGS. 17 and 18 may be performed to distinguish between any two adjacent states of a plurality of states. For example, in a case where the memory cells are 3-bit MLCs having eight states E, P1, P2, P3, P5, P6 and P7 to store three bits of data per memory cell, the nonvolatile memory device may perform the 2-bit soft decision read operation or the 3-bit soft decision read operation in a manner illustrated FIGS. 19, 20 and 21. FIG. 19 illustrates an example of the 2-bit soft decision read operation and an example of the 3-bit soft decision read operation performed when first bits (e.g., LSBs) of data are read from the 3-bit MLCs by using a first reference read voltage VREF1. FIG. 20 illustrates an example of the 2-bit soft decision read operation and an example of the 3-bit soft decision read operation performed when second bits (e.g., CSBs) of data are read from the 3-bit MLCs by using second and third reference read voltages VREF2 and VREF3, and FIG. 21 illustrates an example of the 2-bit soft decision read operation and an example of the 3-bit soft decision read operation performed when third bits (e.g., MSBs) of data are read from the 3-bit MLCs by using fourth through seventh reference read voltages VREF4, VREF5, VREF6 and VREF7.

Figure 22:
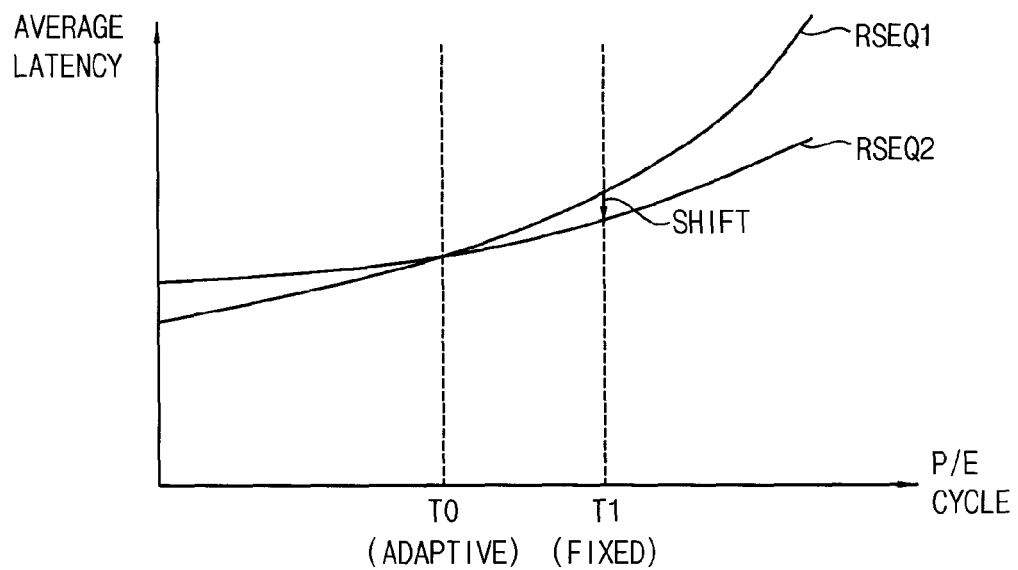
FIGS. 22 and 23 are graphs illustrating exemplary latency reduction effects that may be achieved by using a method of controlling a read sequence of a nonvolatile memory device according to certain embodiments of the inventive concept.
Figure 23:
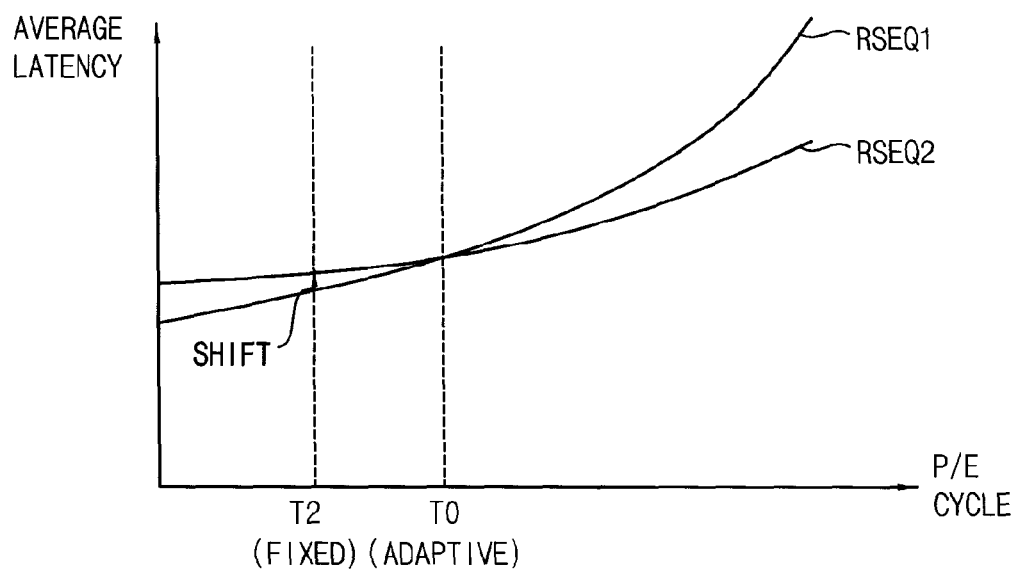

FIGS. 22 and 23 are respective diagrams illustrating a latency reduction effect that may be achieved in accordance with a method of controlling a read sequence of a nonvolatile memory device according to embodiments of the inventive concept.

As described above, the operating conditions of a memory system or memory device may change according to various factors. For example, the number of executed program and erase (P/E) cycles for a nonvolatile memory device can be a major factor in its overall operating condition. FIGS. 22 and 23 illustrate changes of the average latency with respect to the P/E cycles. Generally speaking, as the execution in the number of P/E cycles increases, degeneration in the performance of the memory cells also increases. Thus, the average latency tends to increase with BER. In examples of FIGS. 22 and 23, the first read sequence RSEQ1 is proper to relatively the lower BER while the second read sequence is proper to relatively the higher BER.

As described above, the method of controlling the read sequence may obtain the optimal timing point T0 when the main read sequence is shifted from the first read sequence RSEQ1 to the second read sequence RSEQ2. Referring to FIG. 22, if the shift timing point is fixed to the first timing point T1 after the optimal timing point T0 regardless of the change of the operating condition, the average latency may be increased unnecessarily during the interval T0~T1 because the second read sequence RSEQ2 is selected even though the first read sequence RSEQ1 is more proper during the interval T0~T1. Referring to FIG. 23, if the shift timing point is fixed to the second timing point T2 before the optimal timing point T0 regardless of the change of the operating condition, the average latency may be increased unnecessarily during the interval T2~T0 because the first read sequence RSEQ1 is selected even though the second read sequence RSEQ2 is more proper during the interval T2~T0.

As such, the average latency may be reduced by adaptively determining the shift timing point of the read sequences, and thus the performance of the nonvolatile memory device may be improved.

Figure 24:
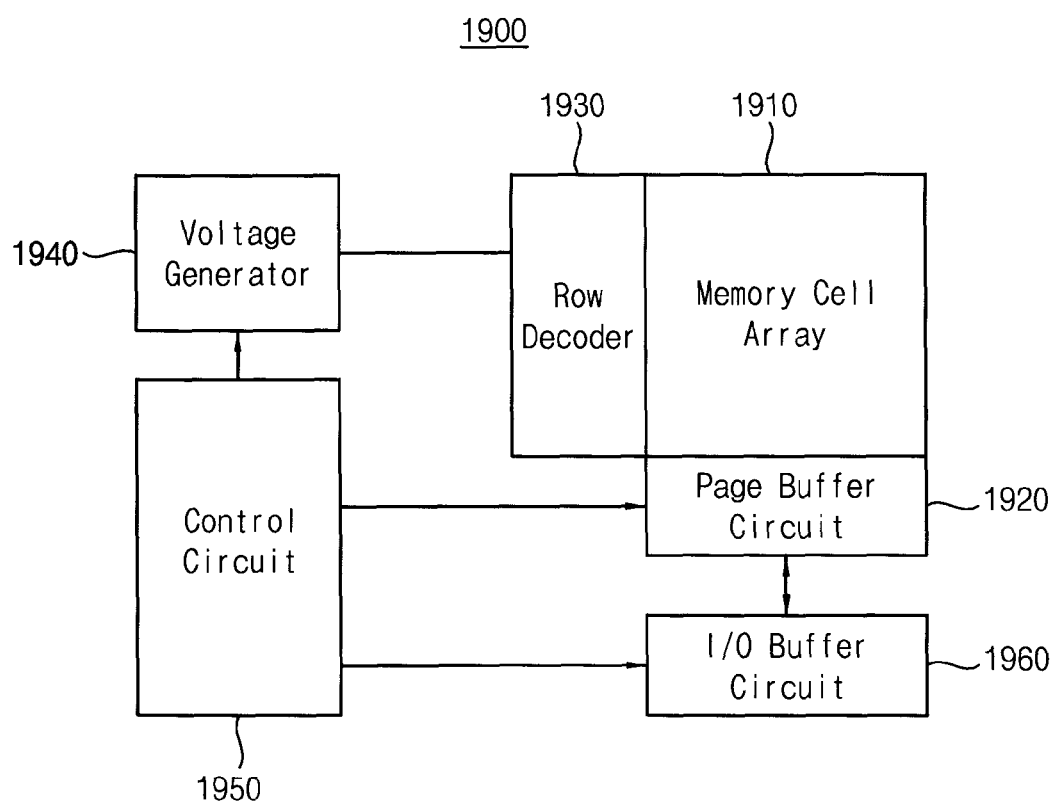
FIG. 24 is a block diagram illustrating a nonvolatile memory device according to certain embodiments of the inventive concept.

FIG. 24 is a block diagram illustrating a nonvolatile memory device according to certain embodiments of the inventive concept.

Referring to FIG. 24, a nonvolatile memory device 1900 includes a memory cell array 1910, a page buffer circuit 1920, a row decoder 1930, a voltage generator 1940, an input/output buffer circuit 1960, and a control circuit 1950. In some embodiments, the nonvolatile memory device 1900 may be a flash memory device. In other embodiments, the nonvolatile memory device 1900 may be a phase random access memory (PRAM), a resistive random access memory (RRAM), a magnetic random access memory (MRAM), a ferroelectric random access memory (FRAM), etc.

The memory cell array 1910 may include a plurality of memory cells coupled to a plurality of word lines and a plurality of bit lines. As described below with reference to FIGS. 25 through 28, the plurality of memory cells may be NAND or NOR flash memory cells, and may be arranged in a two dimensional array structure or a three dimensional vertical array structure.

In some embodiments, the memory cells may be SLCs, each of which stores one data bit therein, or MLCs, each of which stores a plurality of data bits therein. In case of the MLC, a program scheme in a write mode may include various program schemes such as a shadow program scheme, a reprogram scheme or an on-chip buffered program scheme.

The page buffer circuit 1920 may be coupled to the bit lines, and may store write data to be programmed in the memory cell array 1910 or read data that are sensed from the memory cell array 1910. That is, the page buffer circuit 1920 may be operated as a write driver or a sensing amplifier according to an operation mode of the nonvolatile memory device 1900. For example, the page buffer circuit 1920 may be operated as the write driver in a write mode and as the sensing amplifier in a read mode. The input/output buffer circuit 1960 may receive data to be programmed in the memory cell array 1910 from an external memory controller, and may transmit data read from the memory cell array 1910 to the memory controller.

The row decoder 1930 may be coupled to the word lines, and may select at least one of the word lines in response to a row address. The voltage generator 1940 may generate word line voltages, such as a program voltage, a pass voltage, a verification voltage, an erase voltage, a read voltage, etc. according to a control of the control circuit 1950. The control circuit 1950 may control the page buffer circuit 1920, the row decoder 1930, the voltage generator 1940 and the input/output buffer circuit 1960 to perform data storing, erasing and reading operations for the memory cell array 1910.

FIGS. 25, 26, 27 and 28 are respective diagrams illustrating examples of memory cell arrays that may be incorporated within certain nonvolatile memory devices that may be incorporated within embodiments of the inventive concept.

Figure 25:
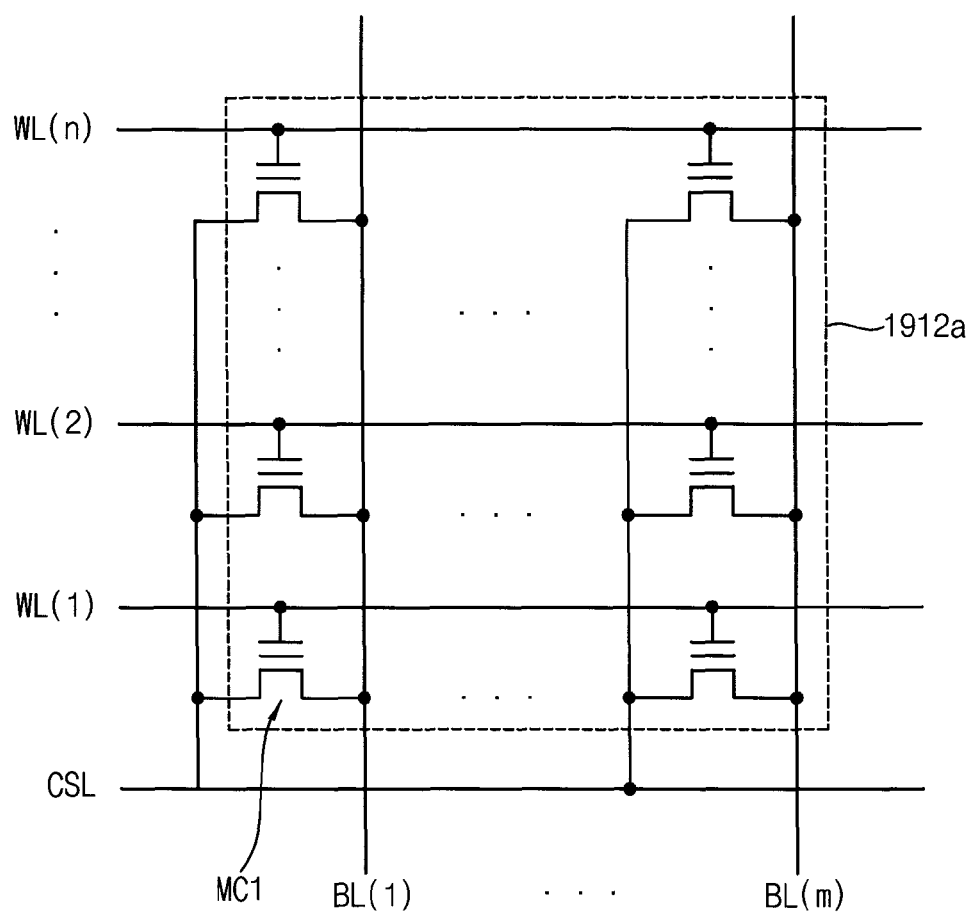
FIGS. 25, 26, 27 and 28 are respective diagrams further illustrating memory cell array(s) that may be incorporated in the nonvolatile memory device of FIG. 24.
Figure 26:
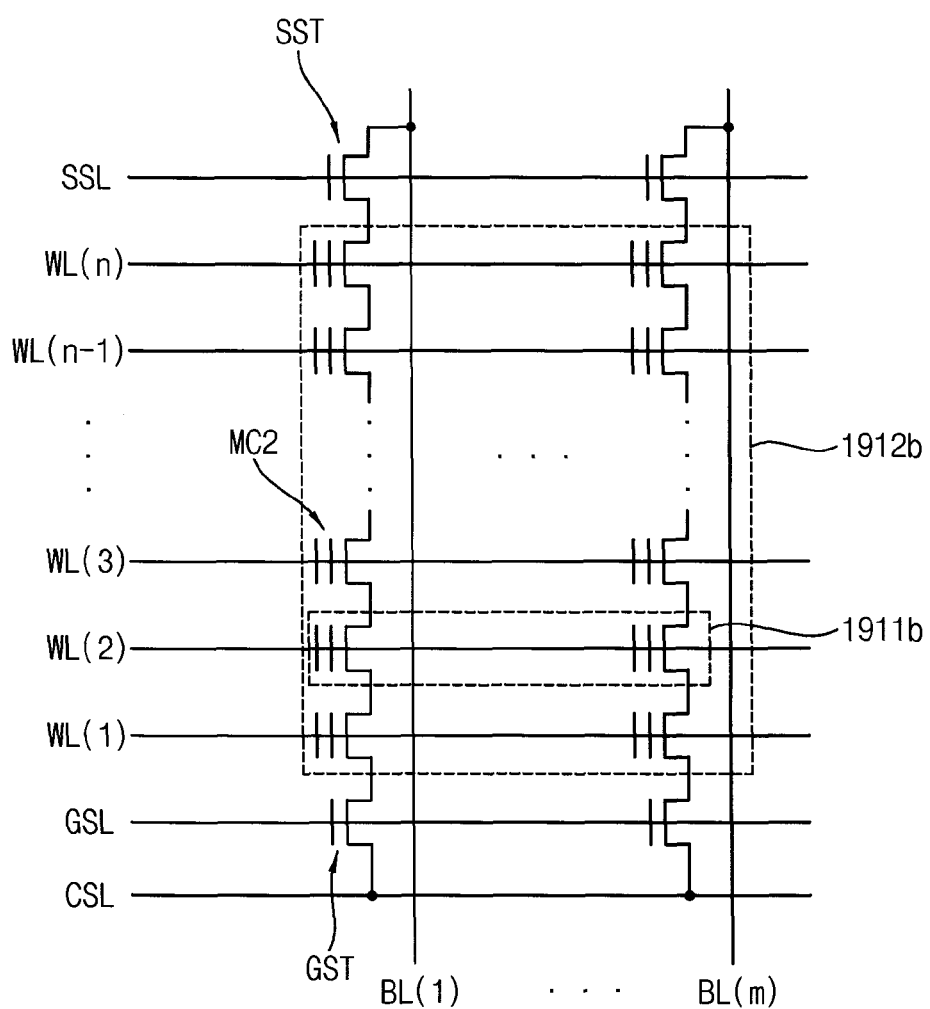
Figure 27:
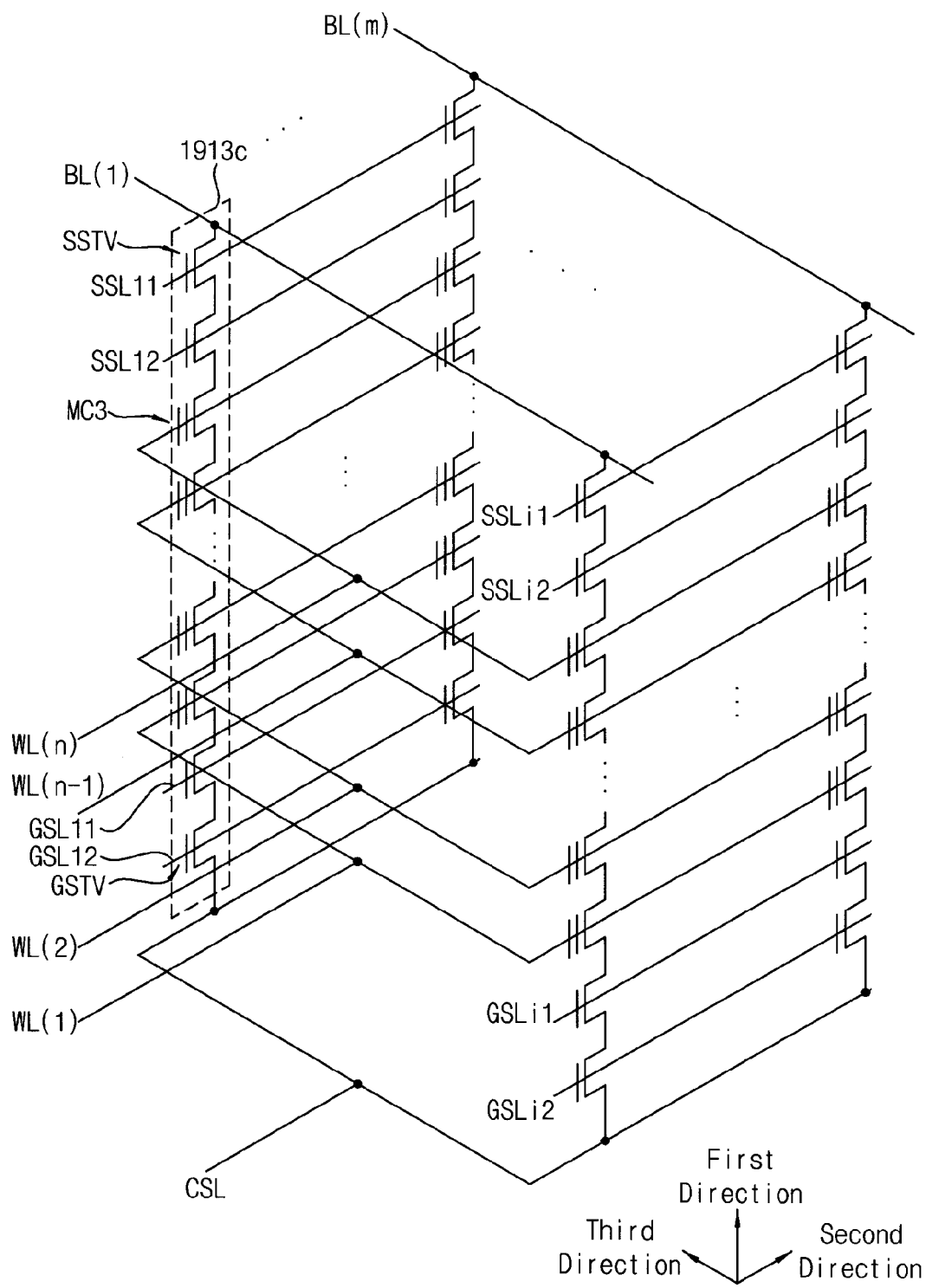
Figure 28:
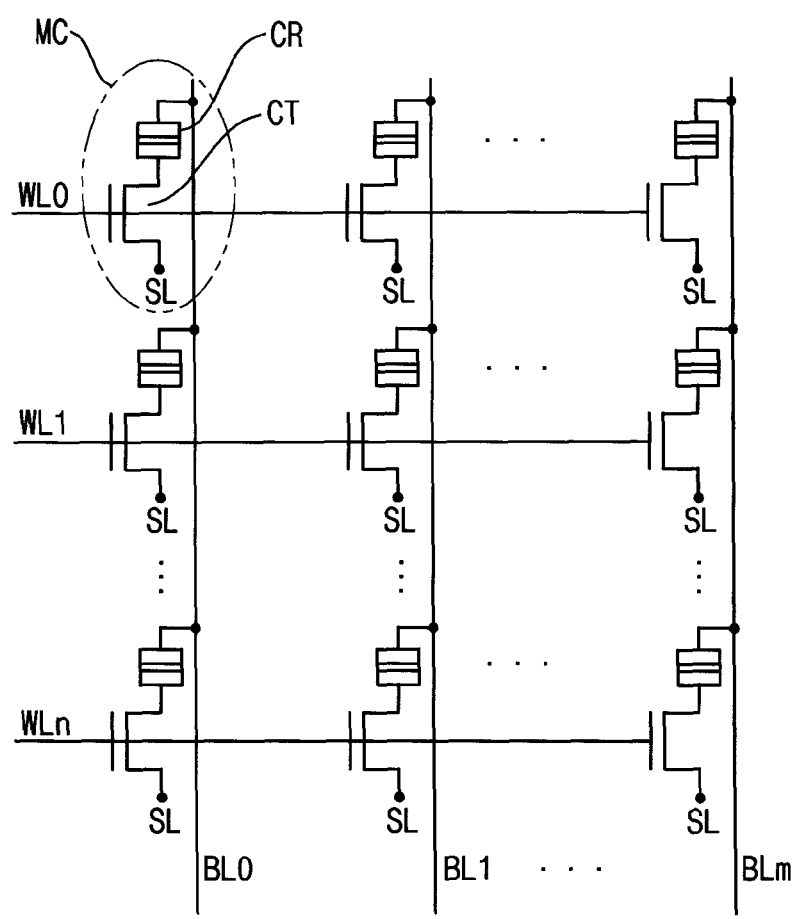

FIG. 25 is a circuit diagram illustrating an example of a memory cell array included in a NOR flash memory device. FIG. 26 is a circuit diagram illustrating an example of a memory cell array included in a NAND flash memory device. FIG. 27 is a circuit diagram illustrating an example of a memory cell array included in a vertical flash memory device. FIG. 28 is a circuit diagram illustrating an example of a memory cell array included in a resistive memory device.

Referring to FIG. 25, a memory cell array 1910a may include a plurality of memory cells MC1. The memory cells MC1 arranged in the same row may be disposed in parallel between one of bit lines BL(1), . . . , BL(m) and a common source line CSL, and may be coupled in common to one of word lines WL(1), WL(2), . . . , WL(n). For example, the memory cells arranged in a first row may be disposed in parallel between a first bit line BL(1) and the common source line CSL. Gate electrodes of the memory cells arranged in the first row may be coupled in common to a first word line WL(1). The memory cells MC1 may be controlled according to a level of a voltage applied to the word lines WL(1), . . . , WL(n). The NOR flash memory device including the memory cell array 1910a may perform write and read operations in units of byte or word, and may perform an erase operation in units of block 1912a.

Referring to FIG. 26, a memory cell array 1910b may include string selection transistors SST, ground selection transistors GST and memory cells MC2. The string selection transistors SST may be coupled to the bit lines BL(1), . . . , BL(m), and the ground selection transistors GST may be coupled to the common source line CSL. The memory cells MC2 arranged in the same row may be disposed in series between one of the bit lines BL(1), . . . , BL(m) and the common source line CSL, and the memory cells MC2 arranged in the same column may be coupled in common to one of the word lines WL(1), WL(2), WL(3), . . . , WL(n-1), WL(n). That is, the memory cells MC2 may be coupled in series between the string selection transistors SST and the ground selection transistors GST, and the 16, 32 or 64 word lines may be disposed between the string selection line SSL and the ground selection line GSL.

The string selection transistors SST are coupled to the string selection line SSL such that the string selection transistors SST may be controlled according to a level of a voltage applied from the string selection line SSL. The memory cells MC2 may be controlled according to a level of a voltage applied to the word lines WL(1), . . . , WL(n).

The NAND flash memory device including the memory cell array 1910b may perform write and read operations in units of page 1911b and an erase operation in units of block 1912b. In some embodiments, each of page buffers may be coupled to even and odd bit lines one by one. In this case, the even bit lines form an even page, the odd bit lines form an odd page, and the write operations for the memory cells MC2 of the even and odd pages may be performed by turns and sequentially.

Referring to FIG. 27, a memory cell array 1910c may include a plurality of strings 1913c having a vertical structure. The plurality of strings 1913c may be formed in a second direction such that a string row may be formed. A plurality of string rows may be formed in a third row such that a string array may be formed. Each of the strings 1913c may include ground selection transistors GSTV, memory cells MC3 and string selection transistors SSTV which are disposed in series in a first direction between the bit lines BL(1), . . . , BL(m) and the common source line CSL.

The ground selection transistors GSTV may be coupled to the ground selection lines GSL11, GSL12, . . . , GSLi1, GSLi2, respectively, and the string selection transistors SSTV may be connected to the string selection lines SSL11, SSL12, . . . , SSLi1, SSLi2, respectively. The memory cells MC3 arranged on the same layer may be coupled in common to one of the word lines WL(1), WL(2), . . . , WL(n-1), WL(n). The ground selection lines GSL11, . . . , GSLi2 and the string selection lines SSL11, . . . , SSLi2 may extend in the second direction and may be formed along the third direction. The word lines WL(1), . . . , WL(n) may extend in the second direction and may be formed along the first and third directions. The bit lines BL(1), ..., BL(m) may extend in the third direction and may be formed along the second direction. The memory cells MC3 may be controlled according to a level of a voltage applied to the word lines WL (1), ..., WL(n).

Since the vertical flash memory device including the memory cell array 1910c includes NAND flash memory cells, like the NAND flash memory device of FIG. 26, the vertical flash memory device performs the write and read operations in units of page and the erase operation in units of block.

In some embodiments, it may be implemented that two string selection transistors included in one string 1913c are coupled to one string selection line, and two ground selection transistors included in one string are coupled to one ground selection line. In other embodiments, it may be implemented that one string includes one string selection transistor and one ground selection transistor.

Referring to FIG. 28, a memory cell array 1910d includes a plurality of memory cells MC, which are disposed at the positions crossed by the wordlines WL0~WLn and the bitlines BL0~BLm.

Each memory cell MC may include a cell transistor CT and a resistive element CR. The cell transistor CT and the resistive element CR in each memory cell MC are coupled between a source line SL and one of the bitlines BL0~BLm. The memory cells MCs may be coupled to the common source line. In some embodiments, the memory cell array 1910d may be partitioned to at least two cell regions and the cell regions may be coupled to the different source lines.

Figure 29:
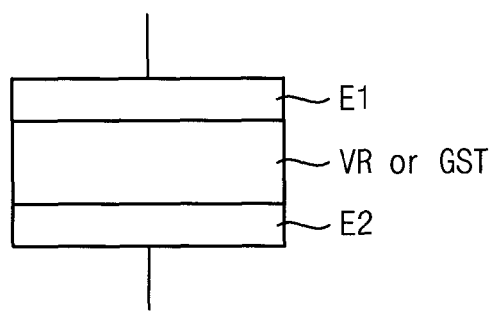
FIG. 29 a diagram illustrating one example of a unipolar resistive element that may be incorporated in the resistive memory cell of FIG. 28.

FIG. 29 a diagram illustrating an example of a unipolar resistive element in the resistive memory cell of FIG. 28.

Referring to FIG. 29, the resistive element may include a first electrode E1, a second electrode E2 and resistive material between the electrodes E1 and E2. The electrodes E1 and E2 may be formed with metal such as tantalum (Ta), platinum (Pt), etc. The resistive material may include transition-metal oxide (VR) such as cobalt oxide, or phase change material such as GeSbTe (GST), etc. The phase change material may be in amorphous state or in crystalline state depending on heating time and/or heating temperature, and thus the phase change material may change its resistance according to phase change.

PRAM using phase change materials, RRAM using materials having variable resistance, and MRAM using ferromagnetism materials may be differentiated from each other, and those may be totally referred to as resistive memories. Method and devices according to embodiments may be applied to various resistive memories including PRAM, RRAM and MRAM.

The resistive material between the electrodes E1 and E2 is required to have a plurality of stable states having different resistance, and various resistive materials are being studied.

For example, while increasing a voltage applied to material having characteristic of Negative Differential Resistance (NDR), resistance of the NDR material abruptly increases at a reset voltage (Vreset), the relatively high resistance is maintained afterwards, and then the NDR material transitions to a state of relatively low resistance at a set voltage (Vset). In this case, the set voltage (Vset) for decreasing the resistance of the NDR material is greater than the reset voltage (Vreset) for decreasing the resistance of the NDR material.

Chalcogenide using telluride compound such as GeSbTe has relatively high resistance when relatively low voltage is applied, and transitions to a state of relatively low resistance if a sufficiently high voltage is applied. In this case, the set voltage (Vset) for decreasing the resistance of the Chalcogenide is smaller than the reset voltage (Vreset) for decreasing the resistance of the Chalcogenide.

As such, an on-state of relatively low resistance and an off-state of relatively high resistance may be programmed or written into memory cells by applying the set voltage (Vset) and the reset voltage (Vreset) corresponding to characteristics of various materials included in the memory cells.

Figure 30:
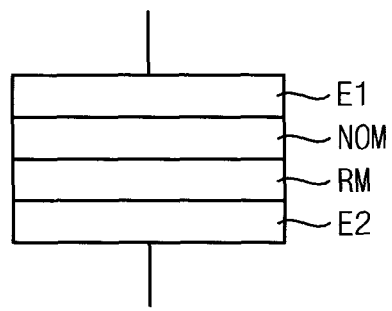
FIG. 30 is a diagram illustrating one example of a bipolar resistive element that may be incorporated in the resistive memory cell of FIG. 28.

FIG. 30 is a diagram illustrating an example of a bipolar resistive element in the resistive memory cell of FIG. 28.

Referring to FIG. 30, the resistive element may include a first electrode E1, a second electrode E2, non-ohmic material (NOM) and resistive material (RM) between the electrodes E1 and E2. In this case, the on-state and the off-state may be programmed or written into memory cells by applying opposite voltages to the electrodes E1 and E2. In other words, the on-state and the off-state may be determined according to polarity of the applied voltage.

Figure 31:
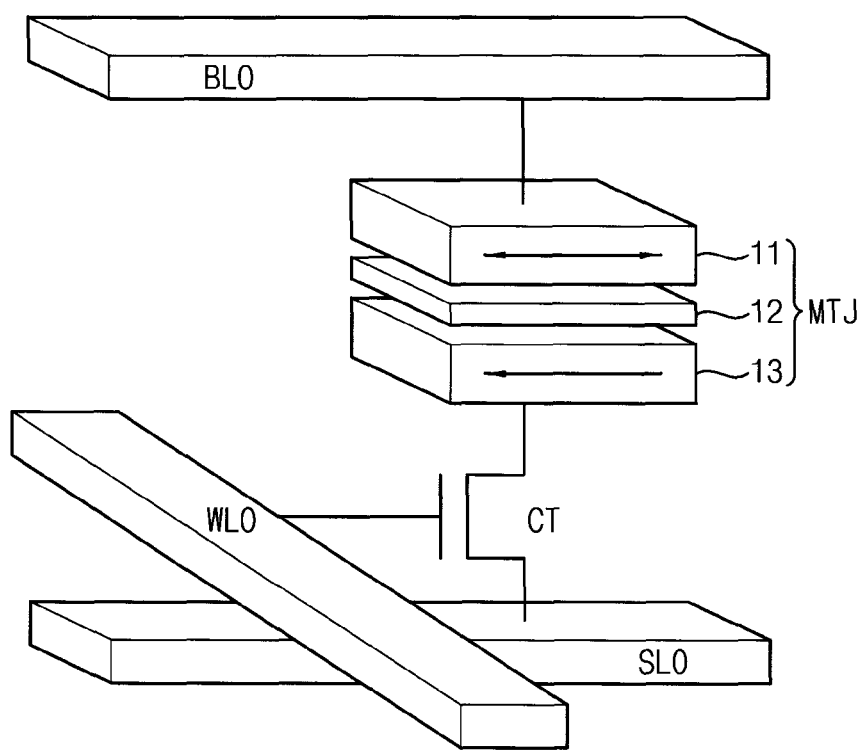
FIG. 31 is a diagram illustrating one example of a spin-transfer torque magneto-resistive random access memory (STT-MRAM) cell that may be incorporated in the memory cell array of FIG. 28.

FIG. 31 is a diagram illustrating an example of a spin-transfer torque magneto-resistive random access memory (STT-MRAM) cell in the memory cell array of FIG. 28.

Referring to FIG. 31, the STT-MRAM cell may include an MTJ element and a cell transistor CT. A gate of the cell transistor CT is coupled to a corresponding wordline WL0, a first electrode of the cell transistor CT is coupled to a corresponding bitline BL0 via the MTJ element, and a second electrode of the cell transistor CT is coupled to a source line SL0.

The MTJ element may include a pinned layer 13, a free layer 11 and a barrier layer 12 between the two layers 11 and 13. The magnetization direction of the pinned layer 13 is fixed but the magnetization direction of the free layer 11 may be varied, according to the written data, between the same direction as or opposite direction to the magnetization direction of the pinned layer 13. In one embodiment, an anti-ferromagnetic layer may be further included in the MTJ element to enforce the magnetization direction of the pinned layer 13.

For example, to perform the write operation of the STT-MRAM cell, a high level voltage is applied to the wordline WL0 to turn on the cell transistor CT, and a write current WC1 or WC2 as illustrated in FIG. 20 is applied between the bitline BL0 and the source line SL0.

For example, to perform the read operation of the STT-MRAM cell, a high level voltage is applied to the wordline WL0 to turn on the cell transistor CT, a read current is applied to flow from the bitline BL0 to the source line SL0, and the resistance value is measured to determine the data stored in the MTJ element.

Figures 32, 33:
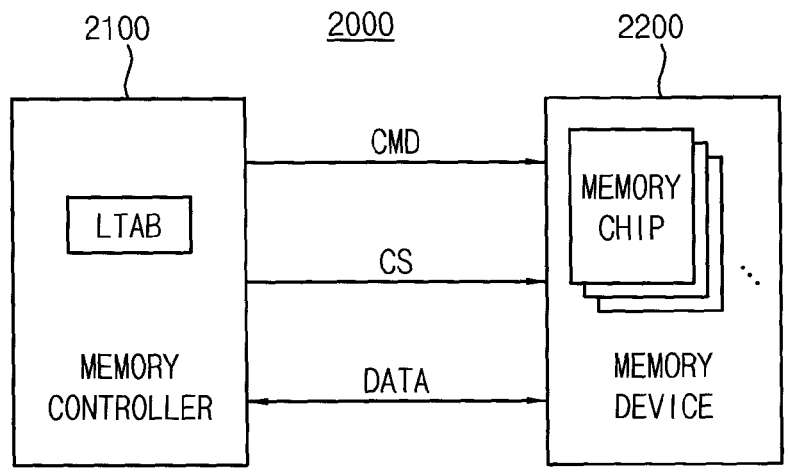
FIG. 32 is a block diagram illustrating a memory system that may incorporate a nonvolatile memory device and memory controller according to certain embodiments of the inventive concept.
FIG. 33 is one example of a latency table that may be stored by the memory controller 2100 of FIG. 32.

FIG. 32 is a block diagram illustrating an example of a memory system including a nonvolatile memory device and a memory controller according to embodiments, and FIG. 33 is a diagram illustrating an example of a latency table stored in the memory controller in FIG. 32.

Referring to FIG. 32, a memory system 2000 may include a memory controller 2100 and a nonvolatile memory device 2200. The write and read operations are performed based on the command CMD that is transferred from the memory controller 2100 to the nonvolatile memory device 2200, and the read or write data are transferred between the memory controller 2100 and the nonvolatile memory device 2200. As illustrated in FIG. 32, the nonvolatile memory device 2200 may include a plurality of memory chips. For example, the memory chips may be mounted on a memory module, and the nonvolatile memory device 2200 may include a plurality of such memory modules. The memory controller 2100 may transfer a chip selection signal CS to the nonvolatile memory device for selecting one memory chip.

When the nonvolatile memory device 2200 includes a plurality of memory chips, monitoring the read latencies (S500) and adjusting the sequence selection rates (S700) in FIG. 1 may be performed independently with respect to at least two memory chips among the memory chips. In other words, the memory controller 2100 may adjust the sequence selection rates independently for each of the memory chips. The common read sequence control with respect to the memory chips may not be appropriate because the memory chips may be manufactured to have different operating characteristics and a portion of the memory chips may be exchanged.

For such independent control per memory chip, the memory controller 2100 may store and manage a latency table LTAB as illustrated in FIG. 33. In the latency table LTAB, chip numbers for discriminating the memory chips and the respective average latencies m(tLATij) may be stored and mapped.

In some embodiments, in case of the MLCs where each MLC is programmed into one of $2^N$ states to store N-bit data, monitoring the read latencies (S500) and adjusting the sequence selection rates (S700) in FIG. 1 may be performed independently with respect to at least two boundary regions among $2^N-1$ boundary regions between the $2^N$ states.

The common read sequence control with respect to the $2^N$ states may not be appropriate when the different read voltages are required to distinguish the one state from the adjacent state. For such independent control, the memory controller 2100 may store and manage a latency table LTAB similar to FIG. 33. In this case, the latency table LTAB may store the index number for indicating the respective read voltages and the respective average latencies m(tLATij).

Figure 34:
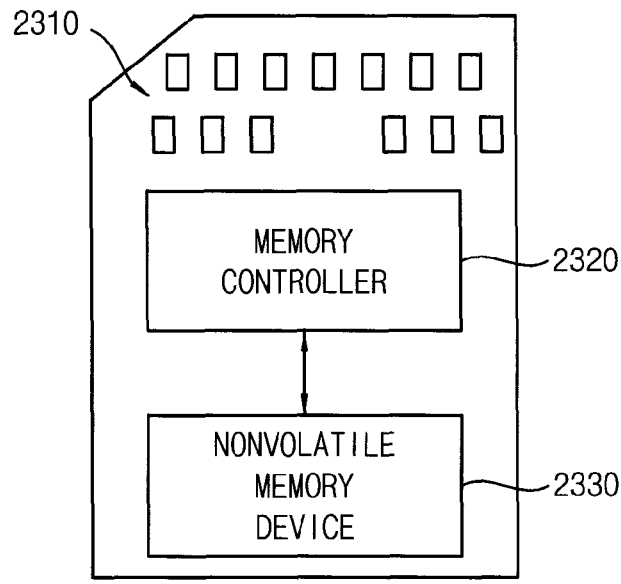
FIG. 34 is a diagram illustrating a memory card that may incorporate a memory system according to one or more embodiments of the inventive concept.

FIG. 34 is a diagram illustrating a memory card including a memory system according to embodiments.

Referring to FIG. 34, a memory card 2300 may include a plurality of connecting pins 2310, a memory controller 2320 and a nonvolatile memory device 2330.

The connecting pins 2310 may be coupled to a host to transfer signals between the host and the memory card 2300. The connecting pins 2310 may include a clock pin, a command pin, a data pin and/or a reset pin.

The memory controller 2320 may receive data from the host, and may store the received data in the nonvolatile memory device 2330. According to embodiments, the memory controller 2320 is configured to store a plurality of read sequences that are set to respectively correspond to operating conditions different from each other, perform the read sequences selectively based on sequence selection rates respectively corresponding to the read sequences, monitor read latencies of the respective read sequences and adjust the sequence selection rates based on monitoring results of the read latencies.

For example, the memory card 2300 may include a multimedia card (MMC), an embedded multimedia card (eMMC), a hybrid embedded multimedia card (hybrid eMMC), a secure digital (SD) card, a micro-SD card, a memory stick, an ID card, a personal computer memory card international association (PCMCIA) card, a chip card, a USB card, a smart card, a compact flash (CF) card, etc.

In some embodiments, the memory card 2300 may be attachable to the host, such as a desktop computer, a laptop computer, a tablet computer, a mobile phone, a smart phone, a music player, a personal digital assistants (PDA), a portable multimedia player (PMP), a digital television, a digital camera, a portable game console, etc.

Figure 35:
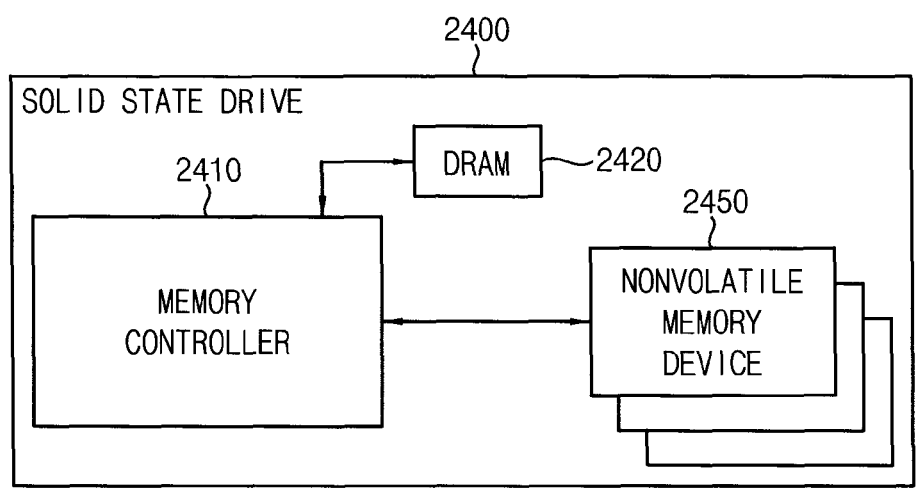
FIG. 35 is a diagram illustrating a solid state drive (SSD) that may incorporate one or more memory system(s) consistent with embodiments of the inventive concept.

FIG. 35 is a diagram illustrating a solid state drive (SSD) that may incorporate a memory system according to certain embodiments of the inventive concept.

Referring to FIG. 35, a solid state drive (SSD) 2400 includes a memory controller 2410, a buffer memory 2420 and a plurality of nonvolatile memory devices 2450.

The memory controller 2410 may receive data from a host. The memory controller 2410 may store the received data in the plurality of nonvolatile memory devices 2450. The buffer memory 2420 may temporarily store data transferred between the host and the plurality of nonvolatile memory devices 2450, and may be implemented by a DRAM located outside the memory controller 2410.

According to embodiments, the memory controller 2410 is configured to store a plurality of read sequences that are set to respectively correspond to operating conditions different from each other, perform the read sequences selectively based on sequence selection rates respectively corresponding to the read sequences, monitor read latencies of the respective read sequences and adjust the sequence selection rates based on monitoring results of the read latencies.

In some embodiments, the solid state drive 2400 may be coupled to the host, such as a mobile device, a mobile phone, a smart phone, a PDA, a PMP, a digital camera, a portable game console, a music player, a desktop computer, a notebook computer, a tablet computer, a speaker, a video, a digital television, etc.

Figure 36:
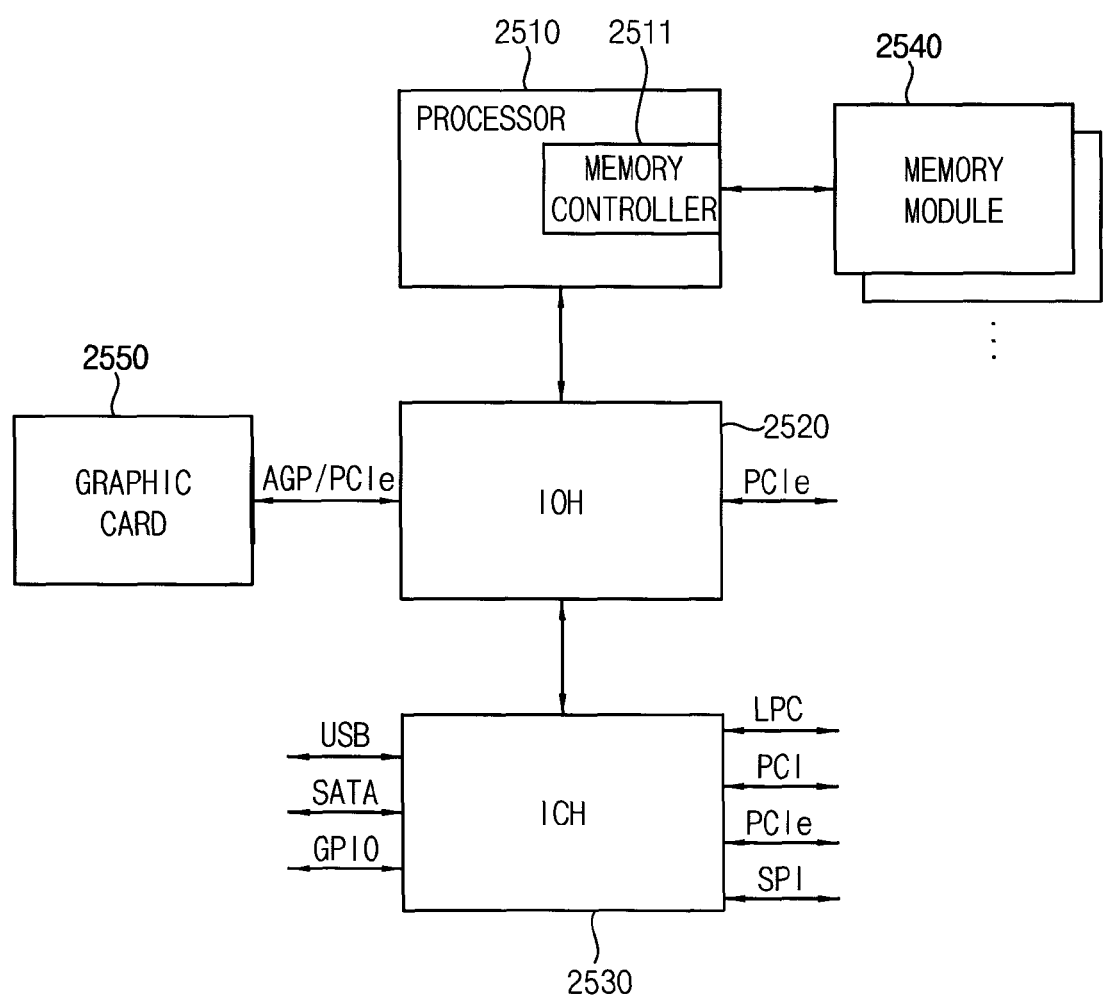
FIGS. 36 and 37 are diagrams illustrating computing systems that may incorporate a memory system according to certain embodiments of the inventive concept.
Figure 37:
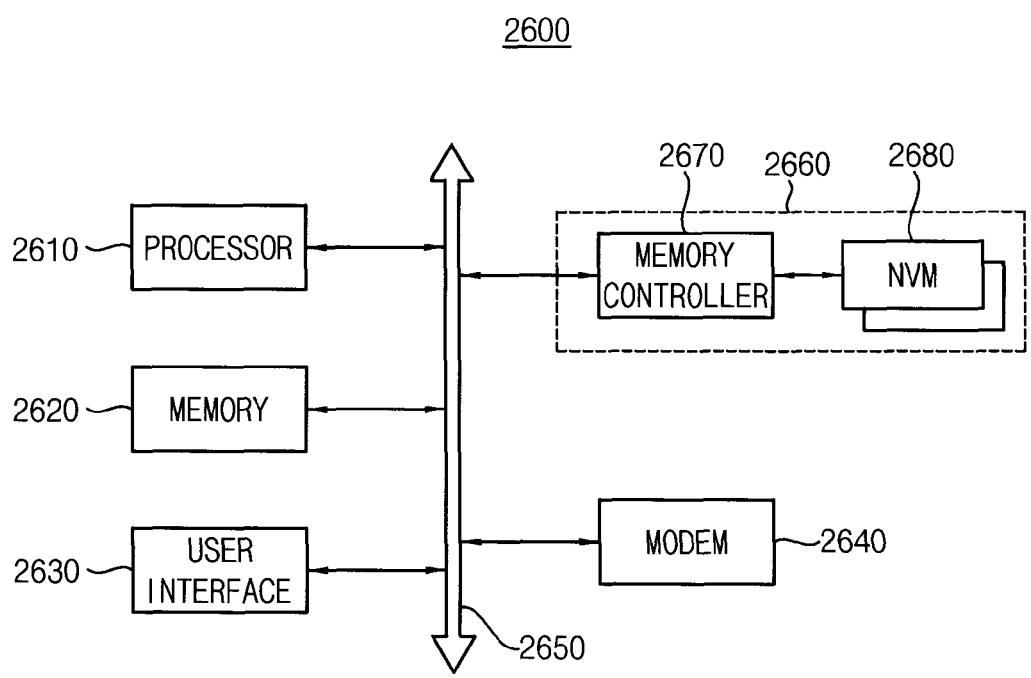

FIGS. 36 and 37 are diagrams illustrating computing systems that may incorporate a memory system according to certain embodiments of the inventive concept.

Referring to FIG. 36, a computing system 2500 may include a processor 2510, an I/O hub 2520, an I/O controller hub 2530, at least one memory module 2540 and a graphic card 2550. According to embodiments, the computing system 2500 may be any computing system, such as a personal computer (PC), a server computer, a workstation, a tablet computer, a laptop computer, a mobile phone, a smart phone, a PDA, a PMP, a digital camera, a digital television, a set-top box, a music player, a portable game console, a navigation device, etc.

The processor 2510 may perform specific calculations or tasks. For example, the processor 2510 may be a microprocessor, a central process unit (CPU), a digital signal processor, or the like. The processor 2510 may include a single processor core or a plurality of processor cores. The processor 2510 may be a multi-core processor, such as a dual-core processor, a quad-core processor, a hexa-core processor, etc. Although the example illustrated in FIG. 36 includes only one processor 2510, other embodiments may include a plurality of processors. In certain embodiments, the processor 2510 may have an associated cache memory located inside or outside the processor 2510.

The processor 2510 may include a memory controller 2511 that controls an operation of the memory module 2540. The memory controller 2511 included in the processor 2510 may be referred to as an integrated memory controller (IMC). A memory interface between the memory controller and the memory module 2540 may be implemented by one channel including a plurality of signal lines, or by a plurality of channels. Each channel may be coupled to at least one memory module 2540. The memory controller may be included in the I/O hub 2520. The I/O hub 1520 including the memory controller may be referred to as a memory controller hub (MCH). According to embodiments, the memory controller 2511 is configured to store a plurality of read sequences that are set to respectively correspond to operating conditions different from each other, perform the read sequences selectively based on sequence selection rates respectively corresponding to the read sequences, monitor read latencies of the respective read sequences and adjust the sequence selection rates based on monitoring results of the read latencies.

The memory module 2540 may include a plurality of nonvolatile memory devices that store data provided from the memory controller 2511. The nonvolatile memory devices may include memory cells, and the memory controller 2511 may perform a read operation on the memory cell array in a unit of a page and perform the ECC decoding on the read data in a unit of a sector.

The I/O hub 2520 may manage data transfer between the processor 2510 and devices, such as the graphic card 2550. The I/O hub 2520 may be coupled to the processor 2510 via at least one of various interfaces, such as a front side bus (FSB), a system bus, a HyperTransport, a lightning data transport (LDT), a QuickPath interconnect (QPI), a common system interface (CSI), etc. Although FIG. 36 illustrates an example of the computing system 2500 including one I/O hub 2520, according to embodiments, the computing system 2500 may include a plurality of I/O hubs.

The I/O hub 2520 may provide various interfaces with the devices. For example, the I/O hub 2520 may provide an accelerated graphics port (AGP) interface, a peripheral component interface-express (PCIe), a communications streaming architecture (CSA) interface, etc.

The graphic card 2550 may be coupled to the I/O hub 2520 via the AGP or the PCIe. The graphic card 2550 may control a display device (not illustrated) for displaying an image. The graphic card 2550 may include an internal processor and an internal memory to process the image. In certain embodiments, the input/output hub 2520 may include an internal graphic device along with or instead of the graphic card 2550. The internal graphic device may be referred to as an integrated graphics, and an I/O hub including the memory controller and the internal graphic device may be referred to as a graphics and memory controller hub (GMCH).

The I/O controller hub 2530 may perform data buffering and interface arbitration to efficiently operate various system interfaces. The I/O controller hub 2530 may be coupled to the I/O hub 2520 via an internal bus. For example, the I/O controller hub 2530 may be coupled to the I/O hub 2520 via at least one of various interfaces, such as a direct media interface (DMI), a hub interface, an enterprise Southbridge interface (ESI), PCIe, etc.

The I/O controller hub 2530 may provide various interfaces with peripheral devices. For example, the I/O controller hub 2530 may provide a universal serial bus (USB) port, a serial advanced technology attachment (SATA) port, a general purpose input/output (GPIO), a low pin count (LPC) bus, a serial peripheral interface (SPI), a PCI, a PCIe, etc.

In certain embodiments, the processor 2510, the I/O hub 2520 and the I/O controller hub 2530 may be implemented as separate chipsets or separate integrated circuits. In other embodiments, at least two of the processor 2510, the I/O hub 2520 and the I/O controller hub 2530 may be implemented as one chipset.

Referring to FIG. 37, a computing system 2600 includes a processor 2610, a memory device 2620, a user interface 2630, a bus 2650 and a memory system 2660. In some embodiments, the computing system 2600 may further include a modem 2640, such as a baseband chipset.

The processor 2610 may perform specific calculations or tasks. For example, the processor 2610 may be a microprocessor, a central processing unit (CPU), a digital signal processor, or the like. The processor 2610 may be coupled to the memory device 2620 via a bus 2650, such as an address bus, a control bus and/or a data bus. For example, the memory device 2620 may be implemented by a DRAM, a mobile DRAM, a SRAM, a PRAM, a FRAM, a RRAM, a MRAM and/or a flash memory. Further, the processor 2610 may be coupled to an extension bus, such as a peripheral component interconnect (PCI) bus, and may control the user interface 2630 including at least one input device, such as a keyboard, a mouse, a touch screen, etc., and at least one output device, a printer, a display device, etc. The modem 2640 may perform wired or wireless communication with an external device. The nonvolatile memory device 2680 of the memory system 2560 may be controlled by a memory controller 2670 to store data processed by the processor 2610 or data received via the modem 2640.

According to embodiments, the memory controller 2670 is configured to store a plurality of read sequences that are set to respectively correspond to operating conditions different from each other, perform the read sequences selectively based on sequence selection rates respectively corresponding to the read sequences, monitor read latencies of the respective read sequences and adjust the sequence selection rates based on monitoring results of the read latencies.

According to embodiments, the computing system may further include a power supply for providing a power supply voltage. According to embodiments, the computing system 2600 may include an application chipset, a camera image processor (CIS), etc.

The inventive concept may be applied to any nonvolatile memory device such as a flash memory device, devices and systems including the nonvolatile memory device. For example, the inventive concept may be applied to various electronic devices, such as a memory card, a solid state drive, a desktop computer, a laptop computer, a tablet computer, a mobile phone, a smart phone, a music player, a personal digital assistants (PDA) a portable multimedia player (PMP), a digital television, a digital camera, a portable game console, etc.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A method of controlling execution of a read sequence in a nonvolatile memory device, the method comprising:
setting read sequences, each read sequence of the read sequences respectively corresponding to a different set of operating conditions;
performing the read sequences based on respective sequence selection rates corresponding to the read sequences;
monitoring read latencies for each one of the read sequences; and
adjusting at least one of the sequence selection rates based on the monitored read latencies.

2. The method of claim 1, wherein each read sequence comprises a plurality of read operations, wherein each read operation of the plurality of read operations has a respective read time different from read times for other read operations among the plurality of read operations.

3. The method of claim 2, wherein each read operation is performed using error checking and correction (ECC) decoding,
read operations of a selected read sequence are performed sequentially until valid data is obtained by the ECC decoding, and
a read latency for the selected read sequence corresponds to a sum of read times of read operations performed until the valid data is obtained.

4. The method of claim 2, wherein the read operations in a read sequence have successively longer read times according to a sequential order of execution.

5. The method of claim 1, wherein the monitoring of the read latencies for each one of the respective read sequences includes calculating average latencies of the respective read sequences based on the read latencies.

6. The method of claim 5, wherein the adjusting of the at least one of the sequence selection rates based on the monitored read latencies comprises:
determining a main read sequence among the read sequences, the main read sequence corresponding to a read sequence having a minimum value of the average latencies; and
setting the sequence selection rate of the main read sequence larger than the sequence selection rates of the other read sequences.

7. The method of claim 6, wherein the sequence selection rate of the main read sequence is set to a maximum value and the sequence selection rates of the other read sequences are respectively set to a minimum value for monitoring the read latencies.

8. The method of claim 5, wherein each of the average latencies is calculated by averaging a predetermined number of the read latencies that are recently detected with respect to the corresponding read sequence.

9. The method of claim 5, wherein each of the average latencies is calculated by averaging a previously-calculated average latency and a currently-detected read latency with respect to the corresponding read sequence.

10. The method of claim 1, wherein the setting of the read sequences comprises:
setting a first read sequence of the read sequences including a first read operation having a first read time such that the first read operation is performed first in the first read sequence; and
setting a second read sequence of the read sequences including a second read operation having a second read time longer than the first read time such that the second read operation is performed first in the second read sequence.

11. The method of claim 10, wherein the first read sequence further includes the second read operation, such that the second read operation is performed after the first read operation if valid data is not obtained by the first read operation.

12. The method of claim 10, wherein each of the first read operation and the second operation is a hard decision read operation that provides hard decision data using a predetermined read voltage and performs an ECC decoding based on the hard decision data.

13. The method of claim 12, wherein a sum of a precharge time and a develop time of the first read operation is shorter than a sum of a precharge time and a develop time of the second read operation.

14. The method of claim 10, wherein the first read operation is a hard decision read operation that provides hard decision data using a predetermined read voltage and performs an ECC decoding based on the hard decision data, and
the second read operation is a soft decision read operation that provides hard decision data using the predetermined read voltage, provides reliability information of the hard decision data using a plurality of read voltages around the predetermined read voltage, and performs the ECC decoding based on the hard decision data and the reliability information.

15. The method of claim 10, wherein the setting of the read sequences further comprises:
setting a third read sequence including a third read operation having a third read time longer than the second read time such that the third read operation is performed first in the third read sequence.

16. The method of claim 15, wherein each of the first and second read operations is a hard decision read operation that provides hard decision data using a predetermined read voltage and performs an ECC decoding based on the hard decision data, and
the third read operation is a soft decision read operation that provides hard decision data using the predetermined read voltage, provides reliability information of the hard decision data using a plurality of read voltages around the predetermined read voltage, and performs the ECC decoding based on the hard decision data and the reliability information.

17. The method of claim 2, wherein each of the read sequences further includes at least one voltage-compensation read operation that performs a valley search operation to determine an optimal read voltage when valid data is not obtained by previous read operations based on a predetermined read voltage, and then performs a read operation based on the optimal read voltage.

18. The method of claim 17, wherein the read operation based on the optimal read voltage is a soft decision read operation that provides hard decision data using the optimal read voltage, provides reliability information of the hard decision data using a plurality of read voltages around the optimal read voltage, and performs ECC decoding based on the hard decision data and the reliability information.

19. The method of claim 1, wherein the nonvolatile memory device includes multi-level memory cells (MLC), each MLC of the MLCs being configured to be programmed into one of $2^N$ states to store N-bit data, where "N" is an integer greater than 1.

20. The method of claim 19, wherein the monitoring of the read latencies and the adjusting of the sequence selection rates are performed independently with respect to at least two boundary regions among $2^N-1$ boundary regions associated with the $2^N$ states.

* * * * *